United States Patent
Nakazumi et al.

(10) Patent No.: US 11,760,871 B2
(45) Date of Patent: Sep. 19, 2023

(54) THERMOSETTING RESIN COMPOSITION, PREPREG, RESIN SHEET, METAL FOIL-CLAD LAMINATE, AND PRINTED WIRING BOARD

(71) Applicant: MITSUBISHI GAS CHEMICAL COMPANY, INC., Tokyo (JP)

(72) Inventors: Yoshihiro Nakazumi, Tokyo (JP); Kentaro Takano, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 249 days.

(21) Appl. No.: 17/285,659

(22) PCT Filed: Oct. 9, 2019

(86) PCT No.: PCT/JP2019/039774
§ 371 (c)(1),
(2) Date: Apr. 15, 2021

(87) PCT Pub. No.: WO2020/080214
PCT Pub. Date: Apr. 23, 2020

(65) Prior Publication Data
US 2021/0395514 A1  Dec. 23, 2021

(30) Foreign Application Priority Data

Oct. 19, 2018  (JP) .................. 2018-197764

(51) Int. Cl.
| | |
|---|---|
| *B32B 3/10* | (2006.01) |
| *C08L 63/00* | (2006.01) |
| *B32B 5/02* | (2006.01) |
| *B32B 15/14* | (2006.01) |
| *B32B 15/20* | (2006.01) |
| *H05K 1/03* | (2006.01) |
| *H05K 1/05* | (2006.01) |
| *C08J 5/24* | (2006.01) |

(52) U.S. Cl.
CPC .............. *C08L 63/00* (2013.01); *B32B 5/024* (2013.01); *B32B 15/14* (2013.01); *B32B 15/20* (2013.01); *C08J 5/244* (2021.05); *C08J 5/249* (2021.05); *H05K 1/0373* (2013.01); *H05K 1/056* (2013.01); *B32B 2260/021* (2013.01); *B32B 2260/046* (2013.01); *B32B 2262/101* (2013.01); *B32B 2307/202* (2013.01); *B32B 2307/206* (2013.01); *B32B 2457/08* (2013.01); *C08J 2363/00* (2013.01); *C08J 2439/04* (2013.01); *C08J 2463/00* (2013.01); *C08J 2465/00* (2013.01); *C08L 2203/20* (2013.01); *C08L 2205/035* (2013.01); *H05K 2201/0355* (2013.01)

(58) Field of Classification Search
None
See application file for complete search history.

(56) References Cited

U.S. PATENT DOCUMENTS

| | | | |
|---|---|---|---|
| 2011/0083890 | A1 | 4/2011 | Tanaka et al. |
| 2014/0349105 | A1 | 11/2014 | Yamazaki et al. |
| 2019/0153224 | A1 | 5/2019 | Nakazumi et al. |

FOREIGN PATENT DOCUMENTS

| | | | |
|---|---|---|---|
| JP | 2008-266406 A | | 11/2008 |
| JP | 2008266406 A | * | 11/2008 |
| JP | 2011-202140 A | | 10/2011 |
| JP | 2016-138194 A | | 8/2016 |
| JP | 2016138194 A | * | 8/2016 |
| JP | 2017-183227 A | | 10/2017 |
| KR | 10-1856859 B1 | | 5/2018 |
| TW | 201700158 A | | 1/2017 |
| WO | 2006/023860 A2 | | 3/2006 |
| WO | 2013/081061 A1 | | 6/2013 |
| WO | 2016/170760 A1 | | 10/2016 |
| WO | WO-2016170760 A1 | * | 10/2016 |
| WO | 2018/147053 A1 | | 8/2018 |

OTHER PUBLICATIONS

Machine translation of WO-2016170760-A1 (Year: 2016).*
Machine translation of JP-2016138194-A (Year: 2016).*
Machine translation of JP-2008266406-A (Year: 2008).*
International Search Report issued in International Patent Application No. PCT/JP2019/039774, dated Dec. 24, 2019, along with English translation thereof.
Written Opinion of the International Searching Authority issued in International Patent Application No. PCT/JP2019/039774, dated Dec. 24, 2019, along with English translation thereof.

* cited by examiner

*Primary Examiner* — Christopher M Polley
(74) *Attorney, Agent, or Firm* — GREENBLUM & BERNSTEIN, P.L.C.

(57) ABSTRACT

A thermosetting resin composition containing a thermosetting resin (A), boron nitride (B), and a dispersant (C) with a pH of 8 or higher.

19 Claims, No Drawings

THERMOSETTING RESIN COMPOSITION, PREPREG, RESIN SHEET, METAL FOIL-CLAD LAMINATE, AND PRINTED WIRING BOARD

TECHNICAL FIELD

The present invention relates to a thermosetting resin composition, a prepreg, a resin sheet, a metal foil-clad laminate, and a printed wiring board.

BACKGROUND ART

Increasing functionality and size reduction of semiconductor packages widely used in electronic devices, communication devices, personal computers, and the like in recent years have been increasingly accelerating high integration and high-density packaging of each component for semiconductor packages. Accordingly, requirement for various properties of printed wiring boards for semiconductor packages are becoming increasingly stringent. Examples of such properties required for the printed wiring boards include thermal conductivity, thermal resistance, and processability for drilling.

Patent Document 1 discloses that a composition containing a resin (A) having a specific melt viscosity and a filler (B) including agglomerated boron nitride particles constituted of a boron nitride primary particle having a specific surface area, total pore volume, and average particle size can achieve a three-dimensional integrated circuit with excellent quality and thermal conductivity.

CITATION LIST

Patent Document

Patent Document 1: WO 2013/081061 Pamphlet

SUMMARY OF INVENTION

Technical Problem

However, the composition described in Patent Document 1 is conceived for a use in a three-dimensional integrated circuit and not for a use in a printed wiring board or the like. In addition, the appearance, melt viscosity, thermal resistance, and processability for drilling of a cured product is not evaluated in this document.

Thus, an object of the present invention is to provide a thermosetting resin composition capable of exhibiting excellent moldability, and excellent appearance, thermal conductivity, and thermal resistance of a cured product in a well-balanced manner; a prepreg; a resin sheet; a metal foil-clad laminate; and a printed wiring board.

Solution to Problem

As a result of diligent research to solve the above problems, the present inventors found that a thermosetting resin composition containing a thermosetting resin (A), boron nitride (B), and a dispersant (C) with a pH of 8 or higher can solve the above problems and completed the present invention.

That is, the present invention is as follows.

(1)

A thermosetting resin composition containing a thermosetting resin (A), boron nitride (B), and a dispersant (C) with a pH of 8 or higher.

(2)

The thermosetting resin composition according to (1), wherein the dispersant (C) is a polymer containing, as a monomer unit, a tertiary amine compound containing a (meth)acryl group and/or a quaternary ammonium compound containing a (meth)acryl group.

(3)

The thermosetting resin composition according to (1) or (2), wherein the dispersant (C) has a block chain (i) containing a repeating unit represented by Formula [i] below:

[Chem. 1]

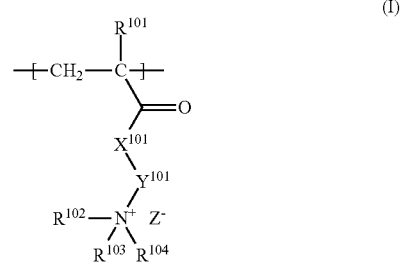

where, in Formula [i], $R^{101}$ represents a hydrogen atom or an alkyl group, $X^{101}$ represents —NH— or —O—; $Y^{101}$ represents a divalent linking group; $R^{102}$ to $R^{104}$ each independently represent an alkyl group, an arylalkyl group, or a heteroarylalkyl group; and $Z^-$ represents a counter anion.

(4)

The thermosetting resin composition according to any one of (1) to (3), wherein the dispersant (C) has a block chain (ii) containing a repeating unit represented by Formula [II] below:

[Chem. 2]

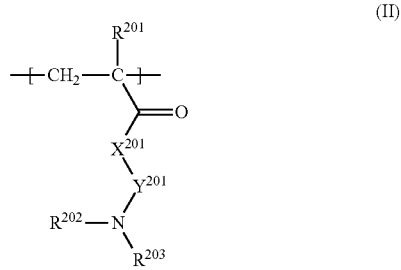

where, in formula [II], $R^{201}$ represents a hydrogen atom or an alkyl group; $X^{201}$ represents —NH— or —O—; $Y^{201}$ represents a divalent linking group; and $R^{202}$ and $R^{203}$ each independently represent an alkyl group, an arylalkyl group, or a heteroarylalkyl group.

(5)

The thermosetting resin composition according to any one of (1) to (4), wherein a content of the dispersant (C) is from 0.1 to 20 parts by mass relative to 100 parts by mass of resin solids.

(6)

The thermosetting resin composition according to any one of (1) to (5), wherein a weight average molecular weight of the dispersant (C) is $1.0 \times 10^3$ or higher and lower than $5.0 \times 10^3$.

(7)

The thermosetting resin composition according to any one of (1) to (6), wherein the thermosetting resin (A) contains one or more selected from the group consisting of a cyanate ester compound (D), a maleimide compound (E), and an epoxy compound (F).

(8)

The thermosetting resin composition according to (7), wherein the cyanate ester compound contains one or more selected from the group consisting of a naphthol aralkyl cyanate ester compound represented by Formula (1) below, a biphenyl aralkyl cyanate ester compound represented by Formula (2) below, and a diallyl bisphenol A cyanate ester compound represented by Formula (3) below:

[Chem. 3]

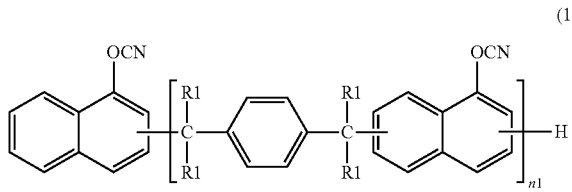

(1)

where R1 each independently represents a hydrogen atom or a methyl group; and n1 represents an integer from 1 to 50;

[Chem. 4]

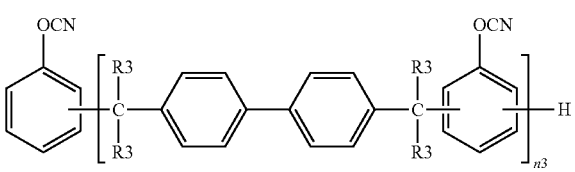

(2)

where R3 each independently represents a hydrogen atom or a methyl group; and n3 represents an integer from 1 to 50.

[Chem. 5]

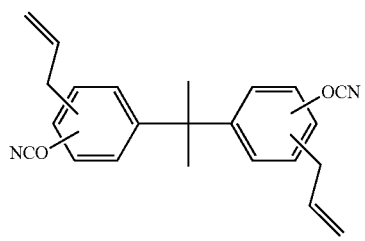

(3)

(9)

The resin composition according to (7) or (8), wherein a content of the cyanate ester compound (D) is from 1 to 90 parts by mass relative to 100 parts by mass of resin solids.

(10)

The thermosetting resin composition according to any of (7) to (9), wherein the maleimide compound (E) contains one or more selected from the group consisting of bis(4-maleimidophenyl)methane, 2,2-bis{4-(4-maleimidophenoxy)-phenyl}propane, bis(3-ethyl-5-methyl-4-maleimidophenyl)methane, a maleimide compound represented by Formula (4) below, and a maleimide compound represented by Formula (5) below:

[Chem. 6]

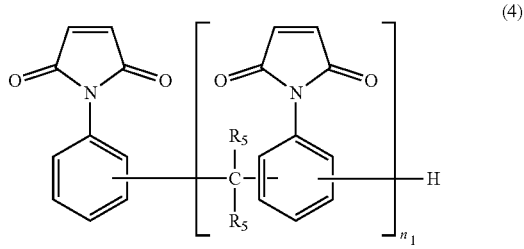

(4)

where, in Formula (4), $R_5$ each independently represents a hydrogen atom or a methyl group; and $n_1$ represents an integer of 1 or greater; and

[Chem. 7]

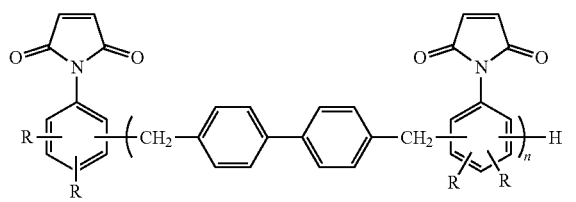

(5)

where, in Formula (5), R's present in plurality each independently represents a hydrogen atom, an alkyl group having from 1 to 5 carbon atoms, or a phenyl group; and n is an average value and represents $1 < n \leq 5$.

(11)

The thermosetting resin composition according to any of (7) to (10), wherein a content of the maleimide compound (E) is from 1 to 90 parts by mass relative to 100 parts by mass of resin solids.

(12)

The thermosetting resin composition according to any of (7) to (11), wherein the epoxy compound (C) is one or more selected from the group consisting of a biphenyl aralkyl epoxy resin, naphthylene ether epoxy resin, trisphenol methane epoxy resin, bisphenol A epoxy resin, bisphenol F epoxy resin, phenol novolac epoxy resin, cresol novolac epoxy resin, bisphenol A novolac epoxy resin, brominated bisphenol A epoxy resin, brominated phenol novolac epoxy resin, biphenyl epoxy resin, phenol aralkyl epoxy resin, and naphthol aralkyl epoxy resin.

(13)

The thermosetting resin composition according to any one of (7) to (12), wherein the epoxy compound (F) includes a polyfunctional epoxy compound having three or more epoxy groups per molecule.

(14)

The thermosetting resin composition according to any one of (7) to (13), wherein a content of the epoxy compound (F) is from 1 to 90 parts by mass relative to 100 parts by mass of resin solids in the resin composition.

(15)

(15)

The thermosetting resin composition according to any one of (1) to (14), wherein a content of the boron nitride (B) is from 1 to 1600 parts by mass relative to 100 parts by mass of resin solids.

(16)

The thermosetting resin composition according to any one of (1) to (15), further containing from 0.1 to 20 parts by mass of a silane coupling agent relative to 100 parts by mass of resin solids.

(17)

The thermosetting resin composition according to any one of (1) to (16), wherein the thermosetting resin composition is for a printed wiring board.

(18)

A prepreg having a substrate and the thermosetting resin composition of any one of (1) to (17), the substrate being impregnated or coated with the thermosetting resin composition.

(19)

A resin sheet having a support and the thermosetting resin composition of any of (1) to (17), thermosetting resin composition being disposed on a surface of the support.

(20)

A metal foil-clad laminate having a laminate formed of one or more selected from the group consisting of the prepreg of (18) and the resin sheet of (19), and a metal foil disposed on one or both sides of the laminate.

(21)

A printed wiring board having an insulating layer and a conductor layer formed on a surface of the insulating layer, wherein the insulating layer contains the thermosetting resin composition of any one of (1) to (17).

Advantageous Effects of Invention

The present invention can provide a thermosetting resin composition capable of exhibiting excellent moldability, and excellent appearance, thermal conductivity, and thermal resistance of a cured product in a well-balanced manner; a prepreg; a resin sheet; a metal foil-clad laminate; and a printed wiring board.

DESCRIPTION OF EMBODIMENTS

Hereinafter, embodiments of the present invention (hereinafter referred to as "the present embodiment") will be described in detail; however, the present invention is not limited to these embodiments, and various modifications may be made without departing from the scope and spirit of the invention.

Unless otherwise noted, "resin solids" as used in the present specification refers to components excluding a solvent and a filler in a thermosetting resin composition of the present embodiment, and "100 parts by mass of resin solids" means that a total amount of components excluding a solvent and a filler in the thermosetting resin composition is 100 parts by mass.

Thermosetting Resin Composition

The thermosetting resin composition of the present embodiment contains a thermosetting resin (A), boron nitride (B), and a dispersant (C) with a pH of 8 or higher (also referred to as a "specific dispersant (C)"). With combination of the thermosetting resin (A), the boron nitride (B), and the specific dispersant (C), the thermosetting resin composition of the present embodiment can exhibit excellent moldability, and excellent appearance, thermal conductivity, thermal resistance, and processability for drilling of a cured product in a well-balanced manner.

Typically, with combination of the thermosetting resin (A) and the boron nitride (B), a resin composition is improved in thermal conductivity, thermal resistance, and processability for drilling (particularly thermal conductivity). However, combining the thermosetting resin (A) and the boron nitride (B) (particularly when increasing the content of boron nitride) excessively increases the melt viscosity of the resin composition (particularly the prepreg and the resin sheet containing the resin composition), resulting in a problem of poor appearance of a cured product and a problem of moldability due to poor adhesion during lamination molding or the like.

Thus, to reduce the melt viscosity during lamination molding or the like, use of a known dispersant often used in resin compositions containing a filler, such as silica or alumina, (e.g., a wet dispersant, such as DISPER BYK-161, 111, 2009, and W903 available from BYK Japan KK) is conceivable, but use of these dispersants cannot sufficiently prevent the increase in melt viscosity (see Comparative Examples of the present application). As a result of diligent research to solve the problems described above, the present inventors found that use of the dispersant (C) with a pH of 8 or higher (specific dispersant (C)) in place of the known dispersant described above can sufficiently prevent the increase in melt viscosity, providing a cured product with excellent appearance and further improving the moldability. A factor for this is thought to be that the dispersant (C) with a pH of 8 or higher readily interacts with boron nitride, and thus facilitates stable dispersion of boron nitride in the thermosetting resin composition of the present embodiment; however, the factor is not limited to this.

Thermosetting Resin (A)

The thermosetting resin (A) is not particularly limited as long as the resin is a compound that is cured by heat, and examples include a cyanate ester compound (D), a maleimide compound (E), an epoxy compound (F), a phenolic compound, an alkenyl-substituted nadimide compound, an oxetane resin, and a benzoxazine compound. One of these thermosetting resins is used alone, or two or more in combination. Among these, from the viewpoints of even better thermal conductivity, thermal resistance, and adhesion, the thermosetting resin (A) preferably contains one or more selected from the group consisting of a cyanate ester compound (D), a maleimide compound (E), and an epoxy compound (F).

Cyanate Ester Compound (D)

Examples of the cyanate ester compound include compounds having one or more cyanato group per molecule. More preferred examples of the cyanate ester compound include aromatic hydrocarbon compounds containing two or more cyanato groups per molecule, compounds in which two aromatic rings containing two or more cyanato groups are bonded by a linking group, novolac cyanate esters, bisphenol cyanate esters, aralkyl cyanate esters, diallyl bisphenol cyanate esters, and prepolymers of these cyanate esters. One of these cyanate ester compounds is used alone, or two or more in combination.

Examples of the aromatic hydrocarbon compounds having two or more cyanato groups per molecule include a compound represented by Formula (I): $Ar—(OCN)_p$, where Ar represents any of a benzene ring, a naphthalene ring, and a biphenyl ring, and p represents an integer of 2 or greater. The compounds of Formula (I) where p is 2 are not particularly limited, but examples include 1,3-dicyanatobenzene, 1,4-dicyanatobenzene, 1,3,5-tricyanatobenzene, 1,3- dicyanatonaphthalene, 1,4-dicyanatonaphthalene, 1,6-dicyanatonaphthalene, 1,8-dicyanatonaphthalene, 2,6-dicyanatonaphthalene, 2,7-dicyanatonaphthalene, 1,3,6-tricyanatonaphthalene, and 4,4'-dicyanatobiphenyl.

The compounds in which two aromatic rings containing two or more cyanato groups are bonded by a linking group are not particularly limited, but examples include bis(4-cyanatophenyl)ether, bis(4-cyanatophenyl)thioether, and bis(4-cyanatophenyl)sulfone.

Examples of the novolac cyanate ester include a compound represented by Formula (1x) below.

[Chem. 8]

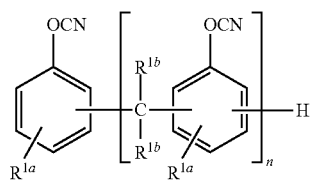
(1x)

In Formula (1x), each aromatic ring may be substituted with a plurality of $R^{1a}$s and the plurality of $R^{1a}$s each independently represent a hydrogen atom or an alkyl group having from 1 to 5 carbon atoms; $R^{1b}$ each independently represents a hydrogen atom or a methyl group (preferably a hydrogen atom); and n represents an integer from 1 to 10.

In Formula (1x), n is an integer from 1 to 10, and from the viewpoints of more effectively and reliably achieving the effects of the present invention, n is preferably an integer from 1 to 6.

The novolac cyanate ester when including a compound represented by Formula (1x) may include a plurality of compounds with the same n or may include a plurality of compounds with different n.

The compound represented by Formula (1x) is not particularly limited, but examples include bis(3,5-dimethyl 4-cyanatophenyl)methane, bis(4-cyanatophenyl)methane, and 2,2'-bis(4-cyanatophenyl)propane.

The bisphenol cyanate ester is not particularly limited, but examples include compounds in which a hydrogen atom of a phenolic hydroxyl group of a bisphenol exemplified in the section of a phenolic compound described later is substituted with a cyan group (—C≡N). Specifically, examples include bisphenol A cyanate esters, bisphenol E cyanate esters, bisphenol F cyanate esters, bisphenol AD cyanate esters, bisphenol B cyanate esters, bisphenol AP cyanate esters, bisphenol S cyanate esters, bisphenol Z cyanate esters, and bisphenol TMC cyanate esters.

For a bisphenol cyanate ester, a commercially available product or a product prepared by a known method may be used. Examples of the commercially available bisphenol cyanate ester include "CA210", which is a product of Mitsubishi Gas Chemical Company, Inc.

The aralkyl cyanate ester is not particularly limited, but examples include naphthol aralkyl cyanate esters and biphenyl aralkyl cyanate esters.

Examples of the naphthol aralkyl cyanate ester include a compound represented by Formula (1) below.

[Chem. 9]

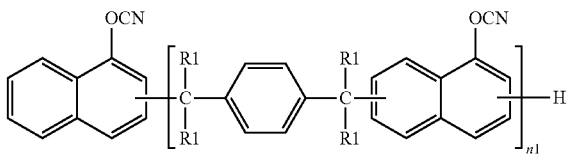
(1)

In Formula (1), R1 each independently represents a hydrogen atom or a methyl group, and n1 represents an integer from 1 to 50. From the viewpoints of more effectively and reliably achieving the effects of the present invention, n1 is preferably an integer from 1 to 10 and more preferably represents an integer from 1 to 6.

The naphthol aralkyl cyanate ester when including a compound represented by Formula (1) may include a plurality of compounds with the same n1 or may include a plurality of compounds with different n1.

Examples of the biphenyl aralkyl cyanate ester include a compound represented by Formula (2) below.

[Chem. 10]

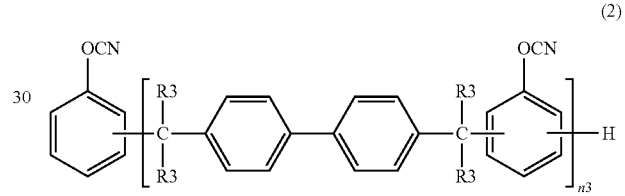
(2)

In Formula (2), R3 each independently represents a hydrogen atom or a methyl group, and n3 represents an integer from 1 to 50. From the viewpoints of more effectively and reliably achieving the effects of the present invention, n3 is preferably an integer from 1 to 10 and more preferably represents an integer from 1 to 6.

The biphenyl aralkyl cyanate ester when including a compound represented by Formula (2) may include a plurality of compounds with the same n3 or may include a plurality of compounds with different n3.

For an aralkyl cyanate ester, a commercially available product or a product synthesized by a known method may be used. Examples of the method of synthesizing the aralkyl cyanate ester include a method of reacting a phenolic resin corresponding to the intended aralkyl cyanate ester (hereinafter, also referred to as a "corresponding phenolic resin"), a cyanogen halide, and a basic compound in an inert organic solvent; and a method of reacting a corresponding phenolic resin and a basic compound in an aqueous solution to form a salt, and reacting the salt and a cyanogen halide by a two-phase interface reaction. In either method, an aralkyl cyanate ester can be produced by cyanating a hydrogen atom of a phenolic hydroxyl group of the corresponding phenolic resin. More specifically, for example, a method described in Examples is used.

The diallyl bisphenol cyanate ester is not particularly limited, but examples include diallyl bisphenol A cyanate esters, diallyl bisphenol F cyanate esters, diallyl bisphenol E cyanate esters, and diallyl bisphenol S cyanate esters. The diallyl bisphenol cyanate ester is preferably a diallyl bisphenol A cyanate ester and more preferably a diallyl bisphenol A cyanate ester represented by Formula (3) below.

[Chem. 11]

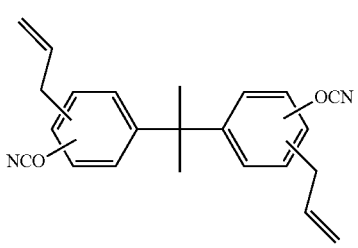

(3)

The cyanate ester compound preferably contains one or more selected from the group consisting of a naphthol aralkyl cyanate ester compound represented by Formula (1) above, a biphenyl aralkyl cyanate ester compound represented by Formula (2) above, and a diallyl bisphenol A cyanate ester compound represented by Formula (3) above from the viewpoints of even better thermal resistance and flame retardancy.

From the viewpoints of even better thermal resistance and flame retardancy, the content of the cyanate ester compound is preferably from 1 to 90 parts by mass, more preferably from 5 to 70 parts by mass, and even more preferably from 10 to 50 parts by mass relative to 100 parts by mass of resin solids.

Maleimide compound (E) The maleimide compound (E) is not particularly limited as long as the compound has one or more maleimide groups per molecule, and examples include monomaleimide compounds having one maleimide group per molecule (e.g., such as N-phenylmaleimide and N-hydroxyphenylmaleimide), polymaleimide compounds having two or more maleimide groups per molecule (e.g., such as bis(4-maleimidophenyl)methane, 2,2-bis{4-(4-maleimidophenoxy)-phenyl}propane, bis(3-ethyl-5-methyl-4-maleimidophenyl)methane, bis(3,5-dimethyl-4-maleimidophenyl)methane, bis(3,5-diethyl-4-maleimidophenyl)methane), m-phenylene bismaleimide, 4-methyl-1,3-phenylene bismaleimide, 1,6'-bismaleimido-(2,2,4-trimethyl)hexane, a maleimide compound represented by Formula (4) below, a maleimide compound represented by Formula (5) below, and prepolymers of these maleimide compounds with an amine compound.

[Chem. 12]

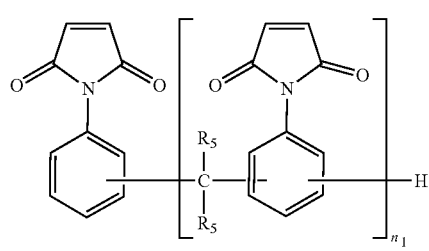

(4)

In Formula (4), $R_5$ each independently represents a hydrogen atom or a methyl group; and $n_1$ represents an integer of 1 or greater.

[Chem. 13]

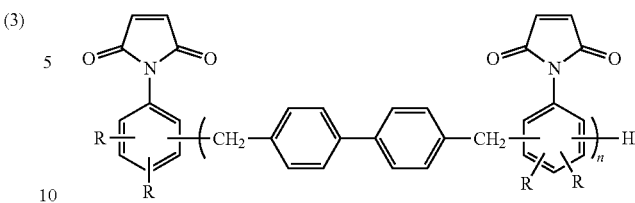

(5)

In Formula (5), R's present in plurality each independently represent a hydrogen atom, an alkyl group having from 1 to 5 carbon atoms (e.g., a methyl group, ethyl group, propyl group, isopropyl group, butyl group, isobutyl group, sec-butyl group, tert-butyl group, pentyl group, 1-methylbutyl group, 2-methylbutyl group, 3-methylbutyl group, 1-ethylpropyl group, 2-ethylpropyl group, 1,1-dimethylpropyl group, 1,2-dimethylpropyl group, and 2,2-dimethylpropyl group), or a phenyl group; and n is an average value and represents $1 < n \leq 5$.

One of these maleimide compounds is used alone, or two or more in combination. Among these, from the viewpoint of even better thermal resistance, the maleimide compound (E) preferably includes one or more selected from the group consisting of bis(4-maleimidophenyl)methane, 2,2-bis{4-(4-maleimidophenoxy)-phenyl}propane, bis(3-ethyl-5-methyl-4-maleimidophenyl)methane, a maleimide compound represented by Formula (4) above, and a maleimide compound represented by Formula (5) above.

For a maleimide compound, a commercially available product or a product prepared by a known method may be used. Examples of the commercially available maleimide compound include "BMI-70", "BMI-80", and "BMI-1000P", which are products of K-I Chemical Industry Co., Ltd.; "BMI-3000", "BMI-4000", "BMI-5100", "BMI-7000", and "BMI-2300", which are products of Daiwa Kasei Industry Co., Ltd.; and "MIR-3000", which is a product of Nippon Kayaku Co., Ltd.

From the viewpoint of even better thermal resistance, the content of the maleimide compound (E) is preferably from 1 to 90 parts by mass, more preferably from 5 to 70 parts by mass, and even more preferably from 10 to 50 parts by mass relative to 100 parts by mass of resin solids.

Epoxy Compound (F)

Examples of the epoxy compound (F) include epoxy compounds having two or more epoxy groups per molecule. Examples of such epoxy compounds include bisphenol epoxy resins (e.g., bisphenol A epoxy resins, bisphenol E epoxy resins, bisphenol F epoxy resins, and bisphenol S epoxy resins), diallyl bisphenol epoxy resins (e.g., such as diallyl bisphenol A epoxy resins, diallyl bisphenol E epoxy resins, diallyl bisphenol F epoxy resins, and diallyl bisphenol S epoxy resins), trisphenol methane epoxy resins, phenolic novolac epoxy resins (e.g., phenol novolac epoxy resins, bisphenol A novolac epoxy resins, and cresol novolac epoxy resins), aralkyl epoxy resins (e.g., such as biphenyl aralkyl epoxy resins, phenol aralkyl epoxy resins, and naphthol aralkyl epoxy resins), biphenyl epoxy resins containing a biphenyl skeleton, naphthalene epoxy resins containing a naphthalene skeleton (naphthylene ether epoxy resins), anthracene epoxy resins containing a anthracene skeleton, glycidyl ester epoxy resins, polyol epoxy resins, isocyanurate ring-containing epoxy resins, dicyclopentadiene epoxy resins, epoxy resins constituted of a bisphenol A structural unit and a hydrocarbon structural unit, and their halogen compounds (e.g., brominated bisphenol A epoxy resins and brominated phenol novolac epoxy resins).

One of these epoxy compounds is used alone, or two or more in combination. Among these, from the viewpoints of even better adhesion and flexibility, the epoxy compound (F) is preferably one or more selected from the group consisting of a bisphenol epoxy resin, trisphenol methane epoxy resin, phenolic novolac epoxy resin, aralkyl epoxy resin, biphenyl epoxy resin, naphthalene epoxy resin, and a halogen compound thereof, more preferably one or more selected from the group consisting of a biphenyl aralkyl epoxy resin, naphthylene ether epoxy resin, trisphenol methane epoxy resin, bisphenol A epoxy resin, bisphenol F epoxy resin, phenol novolac epoxy resin, cresol novolac epoxy resin, bisphenol A novolac epoxy resin, brominated bisphenol A epoxy resin, brominated phenol novolac epoxy resin, biphenyl epoxy resin, phenol aralkyl epoxy resin, and naphthol aralkyl epoxy resin, and particularly preferably one or more selected from the group consisting of a biphenyl aralkyl epoxy resin, naphthylene ether epoxy resin, and naphthol aralkyl epoxy resin.

Aralkyl Epoxy Resin

Examples of the aralkyl epoxy resins include a compound represented by Formula (C1) below.

[Chem. 14]

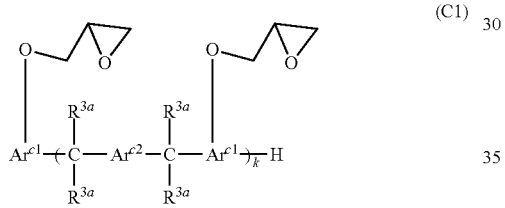

(C1)

In Formula (C1), $Ar^{c1}$ each independently represents a benzene ring or a naphthalene ring; $Ar^{c2}$ represents a benzene ring, a naphthalene ring, or a biphenyl ring; $R^{3a}$ each independently represents a hydrogen atom or a methyl group; k represents an integer from 1 to 50; and each ring may have a substituent other than a glycidyloxy group (e.g., an alkyl group having from 1 to 5 carbon atoms or a phenyl group).

In Formula (C1), k represents an integer from 1 to 50, and from the viewpoints of more effectively and reliably achieving the effects of the present invention, k preferably represents an integer from 1 to 10, more preferably represents an integer from 1 to 6, and is particularly preferably from 1 to 3.

The aralkyl epoxy resin when including a compound represented by Formula (C1) may include a plurality of compounds with the same k or may include a plurality of compounds with different k. The aralkyl epoxy resin when including a plurality of compounds with different k preferably includes a compound of Formula (C1) where k is from 1 to 3.

From the viewpoints of more effectively and reliably achieving the effects of the present invention, the compound represented by Formula (C1) is a compound of Formula (C1) where $Ar^{c1}$ is a benzene ring, and $Ar^{c2}$ is a benzene ring (also referred to as a "phenol aralkyl epoxy resin"); a compound of Formula (C1) where $Ar^{c1}$ is a naphthalene ring, and $Ar^{c2}$ is a benzene ring (also referred to as a "naphthol aralkyl epoxy resin"); and a compound of Formula (C1) where $Ar^{c1}$ is a benzene ring, and $Ar^{c2}$ is a biphenyl ring (also referred to as a "biphenyl aralkyl epoxy resin").

From the viewpoints of more effectively and reliably achieving the effects of the present invention, the biphenyl aralkyl epoxy resin is preferably a compound represented by Formula (C2) below.

[Chem. 15]

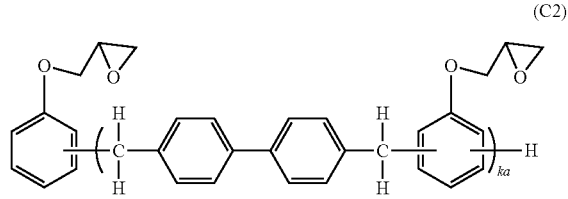

(C2)

In Formula (C2), ka represents an integer from 1 to 10.

In addition, the aralkyl epoxy resin may be a compound represented by Formula (C3) below or Formula (C4) below.

[Chem. 16]

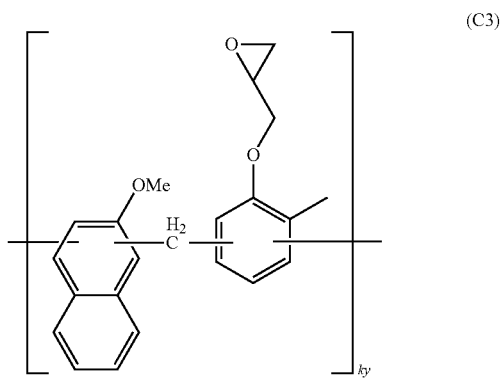

(C3)

In Formula (C3), ky represents an integer from 1 to 10.

[Chem. 17]

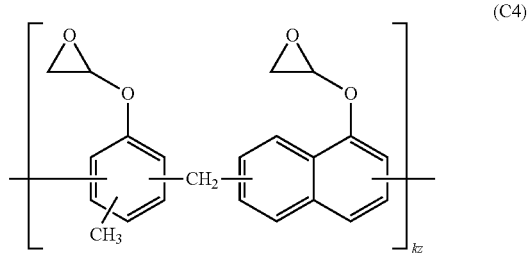

(C4)

In Formula (C4), kz represents an integer from 1 to 10.

For an aralkyl epoxy resin, a commercially available product or a product prepared by a known method may be used. Examples of the commercially available naphthol aralkyl epoxy resin include "Epotote (trade name) ESN-155", "Epotote (trade name) ESN-355", "Epotote (trade name) ESN-375", "Epotote (trade name) ESN-475V", "Epotote (trade name) ESN-485", and "Epotote (trade name) ESN-175", which are products of Nippon Steel &

Sumikin Materials Co., Ltd.; "NC-7000", "NC-7300", and "NC-7300L", which are products of Nippon Kayaku Co., Ltd.; and "HP-5000" and "HP-9900", which are products of DIC Corporation. Examples of the commercially available biphenyl aralkyl epoxy resin include "NC-3000", "NC-3000H", "NC-3000L", and "NC-3000FH", which are products of Nippon Kayaku Co., Ltd.

Naphthalene Epoxy Resin

The naphthalene epoxy resin is not particularly limited, and examples include the epoxy resins having a naphthalene skeleton, which is an epoxy resin excluding the naphthol aralkyl epoxy resins described above. Specific examples of the naphthalene epoxy resin include an epoxy resin represented by Formula (C5) below and naphthylene ether epoxy resins (polyoxynaphthylene epoxy resins). From the viewpoints of more effectively and reliably achieving the effects of the present invention, the naphthalene epoxy resin is preferably a naphthylene ether epoxy resin.

[Chem. 18]

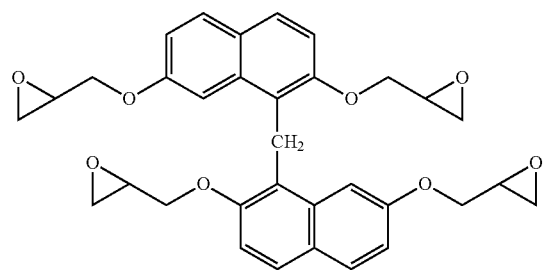

(C5)

For an epoxy resin represented by Formula (C5) above, a commercially available product or a product prepared by a known method may be used. Examples of the commercially available product include "HP-4710", which is a product of DIC Corporation.

Examples of the naphthylene ether epoxy resin include a compound represented by Formula (C6) below.

[Chem. 19]

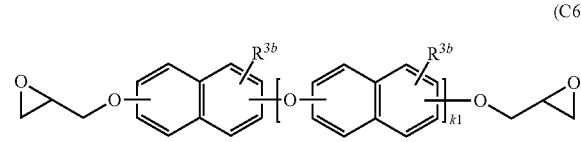

(C6)

In Formula (C6) below, $R^{3b}$ each independently represents a hydrogen atom, an alkyl group having from 1 to 5 carbon atoms, an aralkyl group, a benzyl group, a naphthyl group, or a naphthyl group containing a glycidyloxy group; and k1 represents an integer from 0 to 10.

In Formula (C6), k1 represents an integer from 0 to 10, and from the viewpoints of more effectively and reliably achieving the effects of the present invention, k1 preferably represents an integer from 0 to 6, more preferably represents an integer from 0 to 4, and is particularly preferably 2 to 3.

In Formula (C6), $R^{3b}$ each independently represents a hydrogen atom, an alkyl group having from 1 to 5 carbon atoms, an aralkyl group, and a naphthyl group from the viewpoints of more effectively and reliably achieving the effects of the present invention.

The compound represented by Formula (C6) contains in the molecule preferably from 2 to 6 and more preferably from 2 to 4 glycidyloxy groups containing an epoxy group.

The naphthylene ether epoxy resin when including a compound represented by Formula (C6) may include a plurality of the compounds with the same k1 or may include a plurality of the compounds with different k1. From the viewpoints of more effectively and reliably achieving the effects of the present invention, the naphthylene ether epoxy resin when including a plurality of compounds with different k1 preferably includes a compound of Formula (C6) where k1 is from 0 to 4 and more preferably includes a compound of Formula (C6) where k1 is from 2 to 3.

Examples of the compound represented by Formula (C6) include a compound represented by Formula (C7).

[Chem. 20]

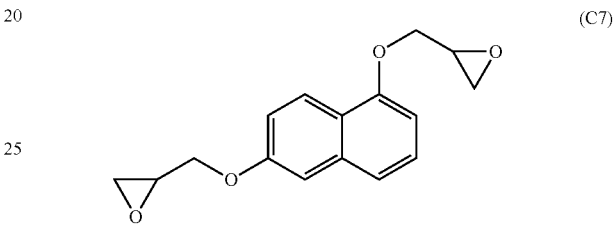

(C7)

For a naphthylene ether epoxy resin, a commercially available product or a product prepared by a known method may be used. Examples of the commercially available naphthylene ether epoxy resin include "HP-4032", "HP-6000", "EXA-7300", "EXA-7310", "EXA-7311", "EXA-7311L", and "EXA7311-G3", which are products of DIC Corporation.

From the viewpoints of even better thermal resistance and adhesion, the epoxy compound (F) preferably includes a polyfunctional epoxy compound having three or more epoxy groups per molecule. Among the epoxy compounds described above, examples of the polyfunctional epoxy compound include epoxy compounds having three or more epoxy groups per molecule. The epoxy compound (F) particularly preferably includes one or more selected from the group consisting of biphenyl aralkyl epoxy resins having three or more epoxy groups per molecule, naphthylene ether epoxy resins having three or more epoxy groups per molecule, and naphthol aralkyl epoxy resins having three or more epoxy groups per molecule.

From the viewpoints of even better thermal resistance and adhesion, the content of the epoxy compound (F) is preferably from 1 to 90 parts by mass, more preferably from 5 to 70 parts by mass, and even more preferably from 10 to 50 parts by mass relative to 100 parts by mass of resin solids.

Phenolic Compound

The phenolic compound is not particularly limited as long as the compound has two or more phenolic hydroxyl groups per molecule, and examples include phenols having two or more phenolic hydroxyl groups per molecule, bisphenols (e.g., such as bisphenol A, bisphenol E, bisphenol F, and bisphenol S), diallyl bisphenols (e.g., such as diallyl bisphenol A, diallyl bisphenol E, diallyl bisphenol F, and diallyl bisphenol S), phenolic novolac resins (e.g., such as phenol novolac resins, naphthol novolac resins, and cresol novolac resins), naphthalene phenolic resins, dihydroanthracene phenolic resins, dicyclopentadiene phenolic resins, biphenyl phenolic resins, and aralkyl phenolic resins. One of these phenolic compounds is used alone, or two or more in combination.

Aralkyl Phenolic Resin

Examples of the aralkyl phenolic resin include a compound represented by Formula (c2) below.

[Chem. 21]

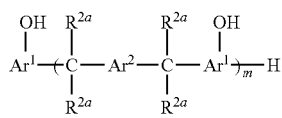
(c2)

In Formula (c2), $Ar^1$ each independently represents a benzene ring or a naphthalene ring; $Ar^2$ represents a benzene ring, a naphthalene ring, or a biphenyl ring; $R^{2a}$ each independently represents a hydrogen atom or a methyl group; m represents an integer from 1 to 50; and each ring may have a substituent other than a hydroxyl group (e.g., such as an alkyl group having from 1 to 5 carbon atoms or a phenyl group).

From the viewpoints of more effectively and reliably achieving the effects of the present invention, the compound represented by Formula (c2) is preferably a compound of Formula (c2) where $Ar^1$ is a naphthalene ring, and $Ar^2$ is a benzene ring (also referred to as a "naphthol aralkyl phenolic resin"); and a compound of Formula (c2) where $Ar^1$ is a benzene ring, and $Ar^2$ is a biphenyl ring (also referred to as a "biphenyl aralkyl phenolic resin").

From the viewpoints of more effectively and reliably achieving the effects of the present invention, the naphthol aralkyl phenolic resin is preferably a compound represented by Formula (2b) below.

[Chem. 22]

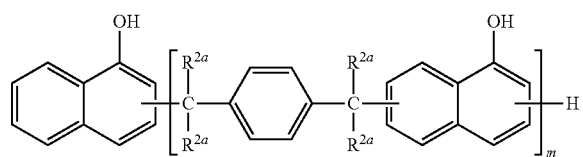
(2b)

In Formula (2b), $R^{2a}$ each independently represents a hydrogen atom or a methyl group (preferably a hydrogen atom); and m represents an integer from 1 to 10 (preferably an integer from 1 to 6).

From the viewpoints of more effectively and reliably achieving the effects of the present invention, the biphenyl aralkyl phenolic resin is preferably a compound represented by Formula (2c) below.

[Chem. 23]

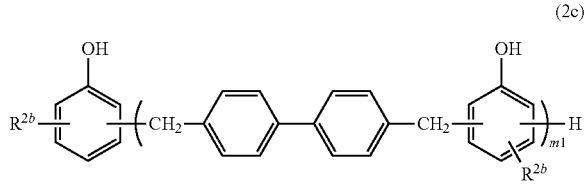
(2c)

In Formula (2c), $R^{2b}$ each independently represents a hydrogen atom, an alkyl group having from 1 to 5 carbon atoms, or a phenyl group (preferably a hydrogen atom); and m1 represents an integer from 1 to 20 (preferably an integer from 1 to 6).

For an aralkyl phenolic resin, a commercially available product or a product synthesized by a known method may be used. Examples of the commercially available aralkyl phenolic resin include "KAYAHARD GPH-65", "KAYAHARD GPH-78", and "KAYAHARD GPH-103" (biphenyl aralkyl phenolic resins), which are products of Nippon Kayaku Co., Ltd.; and "SN-495" (a naphthol aralkyl phenolic resin), which is a product of Nippon Steel Chemical Co., Ltd.

From the viewpoints of more effectively and reliably achieving the effects of the present invention, the content of the phenolic compound is preferably 30 parts by mass or less, more preferably 10 parts by mass or less, and even more preferably 5 parts by mass or less relative to 100 parts by mass of resin solids.

Alkenyl-Substituted Nadimide Compound

The alkenyl-substituted nadimide compound is not particularly limited as long as the compound has one or more alkenyl-substituted nadimide groups per molecule, and examples include a compound represented by Formula (2d) below.

[Chem. 24]

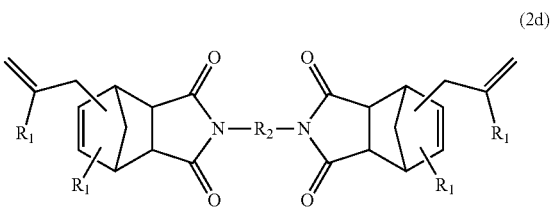
(2d)

In Formula (2d), $R_1$ each independently represents a hydrogen atom or an alkyl group having from 1 to 6 carbon atoms (e.g., a methyl group or an ethyl group); and R2 represents an alkylene group having from 1 to 6 carbon atoms, a phenylene group, a biphenylene group, a naphthylene group, or a group represented by Formula (6) below or Formula (7) below.

[Chem. 25]

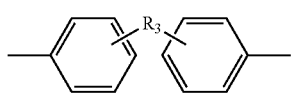
(6)

In Formula (6), $R_3$ represents a methylene group, an isopropylidene group, CO, O, S, or $SO_2$.

[Chem. 26]

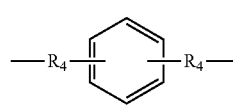
(7)

In Formula (7), $R_4$ each independently represents an alkylene group having from 1 to 4 carbon atoms or a cycloalkylene group having from 5 to 8 carbon atoms.

For an alkenyl-substituted nadimide compound represented by Formula (2d), a commercially available product or a product manufactured according to a known method may be used. Examples of the commercially available product include "BANI-M" and "BANI-X", which are products of Maruzen Petrochemical Co., Ltd.

From the viewpoints of more effectively and reliably achieving the effects of the present invention, the content of the alkenyl-substituted nadimide compound is preferably 30 parts by mass or less, more preferably 10 parts by mass or less, and even more preferably 5 parts by mass or less relative to 100 parts by mass of resin solids.

Examples of the oxetane resin include oxetane; alkyl oxetanes, such as 2-methyloxetane, 2,2-dimethyloxetane, 3-methyloxetane, and 3,3-dimethyloxatane; 3-methyl-3-methoxymethyloxetane; 3,3'-di(trifluoromethyl)perfluoxetane; 2-chloromethyloxetane; 3,3-bis(chloromethyl)oxetane; and biphenyl oxetanes; and "OXT-101" and "OXT-121", which are products of Toagosei Co., Ltd.

The benzoxazine compound is a compound having two or more dihydrobenzoxazine rings per molecule, and examples include "Bisphenol F Benzoxazine BF-BXZ" and "Bisphenol S Benzoxazine BS-BXZ", which are products of Konishi Chemical Ind. Co., Ltd.

The thermosetting resin composition of the present embodiment may contain a compound besides the thermosetting resin (A) described above (an additional component) in a range that does not inhibit the effects of the present invention. Examples of the additional component include compounds having a polymerizable unsaturated group.

Examples of the compound having a polymerizable unsaturated group include vinyl compounds, such as ethylene, propylene, styrene, divinylbenzene, and divinylbiphenyl; (meth)acrylates of a monohydric or polyhydric alcohol, such as methyl (meth)acrylate, 2-hydroxyethyl (meth)acrylate, 2-hydroxypropyl (meth)acrylate, polypropylene glycol di(meth)acrylate, trimethylolpropane di(meth)acrylate, trimethylolpropane tri(meth)acrylate, pentaerythritol tetra(meth)acrylate, and dipentaerythritol hexa(meth)acrylate; epoxy (meth)acrylates, such as bisphenol A epoxy (meth)acrylate and bisphenol F epoxy (meth)acrylate; and benzocyclobutene resins.

Boron nitride (B) The boron nitride (B) is not particularly limited, and examples include hexagonal boron nitride. The shape of the boron nitride (B) may be, for example, scaly, spherical, elliptic, or polygonal but is preferably scaly among these. In addition, the boron nitride (B) may be in an agglomerated powder form of agglomerated primary particles of boron nitride or may be in a surface-treated form with a silane coupling agent.

The average particle size of the boron nitride (B) is not particularly limited and may be, for example, from 0.1 to 20 μm. The average particle size as referred to herein represents the average particle size (median size (D50)) of the primary particles of the boron nitride (B). The average particle size (D50) is determined, for example, by a laser diffraction scattering method.

From the viewpoints of even better moldability and appearance of a cured product, the content of the boron nitride (B) is preferably from 1 to 1600 parts by mass, more preferably from 50 to 1000 parts by mass, even more preferably from 70 to 500 parts by mass, and still more preferably from 70 to 250 parts by mass relative to 100 parts by mass of resin solids.

The ratio of the boron nitride (B) to the dispersant (C) described below is not particularly limited, but from the viewpoints of excellent moldability, appearance of a cured product, and thermal conductivity of a cured product to be produced, the mass ratio of the boron nitride (B)/the dispersant (C) is preferably from 1 to 5000, more preferably from 5 to 1000, and even more preferably from 10 to 500.

Specific Dispersant (C)

The specific dispersant (C) is not particularly limited as long as the dispersant is a known dispersant with a pH of 8 or higher. Among these, from the viewpoints of even better moldability and appearance of a cured product, the specific dispersant (C) is preferably a polymer containing as a monomer unit a tertiary amine compound containing a (meth)acryl group and/or a quaternary ammonium compound containing a (meth)acryl group.

From the viewpoints of even better moldability and appearance of a cured product, the specific dispersant (C) preferably has a block chain (i) containing a repeating unit represented by Formula [I] below.

[Chem. 27]

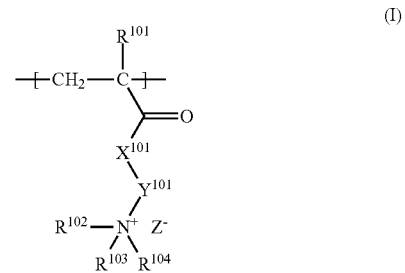

(I)

In Formula [I], $R^{101}$ represents a hydrogen atom or an alkyl group. Examples of the alkyl group include alkyl groups having from 1 to 6 carbon atoms, such as a methyl group, an ethyl group, an n-propyl group, an i-propyl group, an n-butyl group, an s-butyl group, an i-butyl group, a t-butyl group, an n-pentyl group, and an n-hexyl group.

$X^{101}$ represents —NH— or —O—.

$Y^{101}$ represents a divalent linking group. Examples of the divalent linking group include alkylene groups and alkylene-O-alkylene groups (alkylene oxyalkylene groups). Examples of the alkylene group include alkylene groups having from 1 to 10 carbon atoms, such as a methylene group, an ethylene group, a propane-1,3-diyl group, a propane-1,2-diyl group, a butane-1,4-diyl group, a butane-2,3-diyl group, a pentane-1,5-diyl group, a pentane-1,4-diyl group, a 2-methylbutane-1,4-diyl group, a hexane-1,6-diyl group, an octane-1,8-diyl group, and a decane-1,10-diyl group. The alkylene-O-alkylene group refers to a group in which an alkylene group and an alkylene group are bonded via an —O— bond. Examples of the alkylene-O-alkylene group include alkylene-O-alkylene groups having from 2 to 10 carbon atoms, such as an ethylene-O-ethylene group and an ethylene-O-trimethylene group.

$R^{102}$ to $R^{104}$ each independently represent an alkyl group, an arylalkyl group, or a heteroarylalkyl group. Examples of the alkyl group include alkyl groups having from 1 to 6 carbon atoms, such as a methyl group, an ethyl group, an n-propyl group, an i-propyl group, an n-butyl group, an s-butyl group, an i-butyl group, a t-butyl group, an n-pentyl group, and an n-hexyl group. Examples of the arylalkyl group include groups in which an aryl group having from 6 to 10 carbon atoms and an alkyl group having from 1 to 6 carbon atoms are bonded, such as a benzyl group, a phenethyl group, and a 3-phenyl propyl group. Examples of the heteroarylalkyl group include groups including a 5- to 10-membered heteroaryl group having at least one N atom, O atom, or S atom as a heteroatom, and an alkyl group having from 1 to 6 carbon atoms, where the heteroaryl group and the alkyl group are bonded to each other. Such groups include a pyridin-2-ylmethyl group, a pyridin-3-ylmethyl group, and a pyridin-4-ylmethyl group.

$Z^-$ represents a counter anion. Examples of the counter anion include $Cl^-$, $Br^-$, $I^-$, $ClO_4^-$, $BF_4^-$, $CH_3COO^-$, and $PF_6^-$.

The proportion of the repeating unit represented by Formula [I] contained in the block chain (i) is preferably from 10 to 100 mass % and more preferably from 50 to 100 mass % relative to a total mass of the block chain (i). When the proportion of the repeating unit is within the above range, even better moldability and appearance of a cured product may be readily achieved.

From the viewpoints of even better moldability and appearance of a cured product, the specific dispersant (C) preferably has a block chain (ii) containing a repeating unit represented by Formula (II) below.

[Chem. 28]

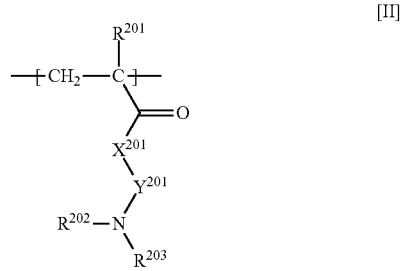

[II]

In Formula [II], $R^{201}$ represents a hydrogen atom or an alkyl group. Examples of the alkyl group include alkyl groups having from 1 to 6 carbon atoms, such as a methyl group, an ethyl group, an n-propyl group, an i-propyl group, an n-butyl group, an s-butyl group, an i-butyl group, a t-butyl group, an n-pentyl group, and an n-hexyl group.

$X^{201}$ represents —NH— or —O—.

$Y^{201}$ represents a divalent linking group. Examples of the divalent linking group include alkylene groups and alkylene-O-alkylene groups (alkylene oxyalkylene groups). Examples of the alkylene group include alkylene groups having from 1 to 10 carbon atoms, such as a methylene group, an ethylene group, a propane-1,3-diyl group, a propane-1,2-diyl group, a butane-1,4-diyl group, a butane-2,3-diyl group, a pentane-1,5-diyl group, a pentane-1,4-diyl group, a 2-methylbutane-1,4-diyl group, a hexane-1,6-diyl group, an octane-1,8-diyl group, and a decane-1,10-diyl group. The alkylene-O-alkylene group refers to a group in which an alkylene group and an alkylene group are bonded via an —O— bond. Examples of the alkylene-O-alkylene group include alkylene-O-alkylene groups having from 2 to 10 carbon atoms, such as an ethylene-O-ethylene group and an ethylene-O-trimethylene group.

$R^{202}$ and $R^{203}$ each independently represent an alkyl group, an arylalkyl group, or a heteroarylalkyl group. Examples of the alkyl group include alkyl groups having from 1 to 6 carbon atoms, such as a methyl group, an ethyl group, an n-propyl group, an i-propyl group, an n-butyl group, an s-butyl group, an i-butyl group, a t-butyl group, an n-pentyl group, and an n-hexyl group. Examples of the arylalkyl group include groups in which an aryl group having from 6 to 10 carbon atoms and an alkyl group having from 1 to 6 carbon atoms are bonded. Such groups include a benzyl group, a phenethyl group, and a 3-phenyl propyl group. Examples of the heteroarylalkyl group include groups including a 5- to 10-membered heteroaryl group having at least one N atom, O atom, or S atom as a heteroatom, and an alkyl group having from 1 to 6 carbon atoms, where the heteroaryl group and the alkyl group are bonded to each other. Such groups include a pyridin-2-ylmethyl group, a pyridin-3-ylmethyl group, and a pyridin-4-ylmethyl group.

The proportion of the repeating unit represented by Formula [II] contained in the block chain (ii) is preferably from 10 to 100 mass % and more preferably from 50 to 100 mass % relative to a total mass of the block chain (ii). When the proportion of the repeating unit is within the above range, even better moldability and appearance of a cured product may be readily achieved.

From the viewpoints of even better moldability and appearance of a cured product, the specific dispersant (C) preferably has a block chain (iii) containing a repeating unit represented by Formula [I] and a repeating unit represented by Formula [II].

The ratio of the content of the repeating unit represented by Formula [I] to the content of the repeating unit represented by Formula [II] in the block chain (iii) may be (the content of the repeating unit represented by Formula [I]): (the content of the repeating unit represented by Formula [II]) of 1:99 to 99:1 or 10:90 to 90:10.

From the viewpoints of even better moldability and appearance of a cured product, the specific dispersant (C) is preferably a block polymer having the block chain (i), the block chain (ii), or the block chain (iii), and a block chain (iv) having a repeating unit represented by Formula [III] below.

[Chem. 29]

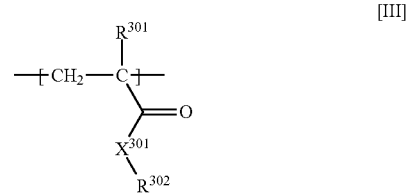

[III]

In Formula [III], $R^{301}$ represents a hydrogen atom or an alkyl group. Examples of the alkyl group include alkyl groups having from 1 to 6 carbon atoms, such as a methyl group, an ethyl group, an n-propyl group, an i-propyl group, an n-butyl group, an s-butyl group, an i-butyl group, a t-butyl group, an n-pentyl group, and an n-hexyl group.

$X^{301}$ represents —NH— or —O—.

$R^{302}$ each independently represents an alkyl group, an arylalkyl group, or a heteroarylalkyl group. Examples of the alkyl group include alkyl groups having from 1 to 6 carbon atoms, such as a methyl group, an ethyl group, an n-propyl group, an i-propyl group, an n-butyl group, an s-butyl group, an i-butyl group, a t-butyl group, an n-pentyl group, and an n-hexyl group. Examples of the arylalkyl group include groups in which an aryl group having from 6 to 10 carbon atoms and an alkyl group having from 1 to 6 carbon atoms are bonded. Such groups include a benzyl group, a phenethyl group, and a 3-phenyl propyl group. Examples of the heteroarylalkyl group include groups including a 5- to 10-membered heteroaryl group having at least one N atom, O atom, or S atom as a heteroatom, and an alkyl group having from 1 to 6 carbon atoms, where the heteroaryl group and the alkyl group are bonded to each other. Such groups include a pyridin-2-ylmethyl group, a pyridin-3-ylmethyl group, and a pyridin-4-ylmethyl group.

The proportion of the repeating unit represented by Formula [III] contained in the block chain (iv) is preferably from 10 to 100 mass % and more preferably from 50 to 100 mass % relative to a total mass of the block chain (iv). When the proportion of the repeating unit is within the above range, even better moldability and appearance of a cured product may be readily achieved.

The block chain (iv) may contain, for example, a repeating unit represented by Formula [IV] in addition to the repeating unit represented by Formula [III].

[Chem. 30]

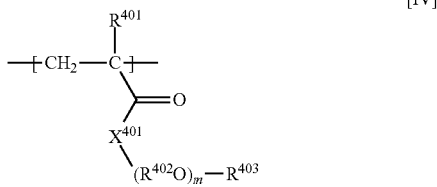

[IV]

In Formula [IV], $R^{401}$ represents a hydrogen atom or an alkyl group. Examples of the alkyl group include alkyl groups having from 1 to 6 carbon atoms, such as a methyl group, an ethyl group, an n-propyl group, an i-propyl group, an n-butyl group, an s-butyl group, an i-butyl group, a t-butyl group, an n-pentyl group, and an n-hexyl group.

$X^{401}$ represents —NH— or —O—.

$R^{402}$ represents an alkylene group or an alkylene-O-alkylene group. Examples of the alkylene group include alkylene groups having from 1 to 10 carbon atoms, such as a methylene group, an ethylene group, a propane-1,3-diyl group, a propane-1,2-diyl group, a butane-1,4-diyl group, a butane-2,3-diyl group, a pentane-1,5-diyl group, a pentane-1,4-diyl group, a 2-methylbutane-1,4-diyl group, a hexane-1,6-diyl group, an octane-1,8-diyl group, and a decane-1,10-diyl group. The alkylene-O-alkylene group refers to a group in which an alkylene group and an alkylene group are bonded via an —O— bond. Examples of the alkylene-O-alkylene group include alkylene-O-alkylene groups having from 2 to 10 carbon atoms, such as an ethylene-O-ethylene group and an ethylene-O-trimethylene group.

m represents an integer from 1 to 100.

$R^{403}$ represents a hydrogen atom or an alkyl group. Examples of the alkyl group include alkyl groups having from 1 to 6 carbon atoms, such as a methyl group, an ethyl group, an n-propyl group, an i-propyl group, an n-butyl group, an s-butyl group, an i-butyl group, a t-butyl group, an n-pentyl group, and an n-hexyl group.

The block chains (i) to (iv) may contain an additional repeating unit besides those described above, and examples of such a repeating unit include repeating units derived from a (meth)acrylate monomer, an aromatic vinyl monomer, a conjugated diene monomer, or the like other than those described above.

Examples of the (meth)acrylate monomer include (meth) acrylic acid; (meth)acrylic ester compounds, such as methyl (meth)acrylate, ethyl(meth)acrylate, n-propyl(meth)acrylate, i-propyl(meth)acrylate, n-butyl(meth)acrylate, i-butyl (meth)acrylate, s-butyl(meth)acrylate, t-butyl(meth) acrylate, hexyl(meth)acrylate, glycidyl(meth)acrylate, cyclohexyl(meth)acrylate, 2-ethylcyclohexyl(meth)acrylate, 1-ethylcyclohexyl(meth)acrylate, and benzyl(meth)acrylate; and 2-methoxyethyl(meth)acrylate, methoxypolyethylene glycol(meth)acrylate (having from 2 to 100 units of ethylene glycol), ethoxypolyethylene glycol(meth)acrylate, and phenoxypolyethylene glycol(meth)acrylate. One of these (meth) acrylate monomers is used alone, or two or more in combination.

Examples of the aromatic vinyl monomer include styrene, o-methylstyrene, p-methylstyrene, p-t-butylstyrene, α-methylstyrene, p-t-butoxystyrene, m-t-butoxystyrene, p-(1-ethoxyethoxy)styrene, 2,4-dimethylstyrene, vinylaniline, vinylbenzoic acid, vinylnaphthalene, vinylanthracene; heteroaryl compounds, such as 2-vinylpyridine, 4-vinylpyridine, 2-vinylquinoline, 4-vinylquinoline, 2-vinylthiophene, and 4-vinylthiophene. One of these aromatic vinyl monomers is used alone, or two or more in combination.

Examples of the conjugated diene monomer include, 1,3-butadiene, isoprene, 2-ethyl-1,3-butadiene, 2-t-butyl-1,3-butadiene, 2-phenyl-1,3-butadiene, 2,3-dimethyl-1,3-butadiene, 1,3-pentadiene, 2-methyl-1,3-pentadiene, 3-methyl-1,3-pentadiene, 1,3-hexadiene, 2-methyl-1,3-octadiene, 4,5-diethyl-1,3-octadiene, 3-butyl-1,3-octadiene, 1,3-cyclopentadiene, 1,3-cyclohexadiene, 1,3-cyclooctadiene, 1,3-tricyclodecadiene, myrcene, and chloroprene. One of these conjugated diene monomers is used alone, or two or more in combination.

A specific dispersant (C) prepared by a known method (e.g., such as a method described in WO 2016/170760 Pamphlet) or commercially available is used.

The pH of the specific dispersant (C) is 8 or higher, and from the viewpoints of even better moldability and appearance of a cured product, the pH of is preferably 8.2 or higher and more preferably 8.4 or higher. The pH is determined by a method described in Examples.

From the viewpoints of even better moldability and appearance of a cured product, the weight average molecular weight of the specific dispersant (C) is preferably $1.0 \times 10^3$ or higher and less than $5.0 \times 10^3$, more preferably $2.0 \times 10^3$ or higher and $4.5 \times 10^3$ or lower, and even more preferably $3.0 \times 10^3$ or higher and $4.0 \times 10^3$ or lower. In addition, when the specific dispersant (C) weight average molecular weight is less than $5.0 \times 10^3$, the effect on dispersion may be further improved. The weight average molecular weight is determined, for example, by GPC (calibrated with polystyrene).

The content of the specific dispersant (C) is preferably from 0.1 to 20 parts by mass, more preferably from 0.5 to 15 parts by mass, even more preferably from 0.5 to 10 parts by mass, still more preferably from 0.8 to 10 parts by mass, and particularly preferably from 1.0 to 10 parts by mass relative to 100 parts by mass of resin solids. When the content of the specific dispersant (C) is 0.1 parts by mass or greater, even better moldability and appearance of a cured product may be readily achieved, and when the content is 20 parts by mass or less, even better moldability, thermal resistance, and thermal conductivity may be readily achieved.

The thermosetting resin composition of the present embodiment may contain an inorganic filler besides the boron nitride (B). Examples of such an inorganic filler include silica, silicon compounds (e.g., such as precipitated silica), metal oxides (e.g., such as alumina, titanium white, zinc oxide, magnesium oxide, and zirconium oxide), metal nitrides (e.g., such as silicon nitride and aluminum nitride), metal sulfates (e.g., such as barium sulfate), metal hydroxides (e.g., such as aluminum hydroxide, heat-treated aluminum hydroxide (e.g., those produced by heat-treating aluminum hydroxide to remove part of crystal water), boehmite, and magnesium hydroxide), molybdenum compounds (e.g., such as molybdenum oxide and zinc molybdate), zinc compounds (e.g., such as zinc borate and zinc stannate), clay, kaolin, talc, calcined clay, calcined kaolin, calcined talc, mica, E-glass, A-glass, NE-glass, C-glass, L-glass, D-glass, S-glass, M-glass G-20, short glass fibers (including glass fine powders of E glass, T glass, D glass, S glass, Q glass, or the like), hollow glass, and spherical glass. One of these inorganic fillers is used alone, or two or more in combination. Among these, from the viewpoint of further improving low thermal expansion, the inorganic filler is preferably at least one selected from the group consisting of a metal hydroxide and a metal oxide, more preferably contains at least one selected from the group consisting of silica, boehmite, and alumina, and even more preferably is silica.

Examples of the silica include natural silica, fused silica, synthetic silica, Aerosil, and hollow silica. One of these silicas is used alone, or two or more in combination. Among these, the silica is preferably fused silica from the viewpoint of dispersibility and more preferably two or more types of fused silicas with different particle sizes from the viewpoints of filling properties and fluidity.

From the viewpoints of more effectively and reliably achieving the effects of the present invention, the content of the inorganic filler is preferably 500 parts by mass or less, more preferably 300 parts by mass or less, and even more preferably 100 parts by mass or less relative to 100 parts by mass of resin solids.

Silane Coupling Agent

The thermosetting resin composition of the present embodiment may contain a silane coupling agent. When the thermosetting resin composition contains a silane coupling agent, the dispersibility of the boron nitride (B) in the thermosetting resin composition and adhesion strength between the components of the thermosetting resin composition and a substrate described later may be further improved.

The silane coupling agent is not particularly limited, and examples include silane coupling agents commonly used in surface treatment of inorganic materials. Such examples include aminosilane-based compounds (e.g., such as γ-aminopropyltriethoxysilane, N-β-(aminoethyl)-γ-aminopropyltrimethoxysilane), epoxysilane-based compounds (e.g., such as γ-glycidoxypropyltrimethylsilane and γ-glycidoxypropyltrimethoxysilane), acrylic silane-based compounds (e.g., such as γ-acryloxypropyltrimethoxysilane), cationic silane-based compounds (e.g., such as N-β-(N-vinylbenzylaminoethyl)-γ-aminopropyltrimethoxysilane hydrochloride), styryl silane-based compounds, and phenylsilane-based compounds. One of the silane coupling agents is used alone, or two or more in combination. Among these, the silane coupling agent is preferably an epoxysilane compound. Examples of the epoxysilane compound include "Z6040", which is a product of Dow Corning Toray Co., Ltd.; "KBM-403", "KBM-303", "KBM-402", and "KBE-403", which are products of Shin-Etsu Chemical Co., Ltd.

When the thermosetting resin composition contains a silane coupling agent, the content is not particularly limited but may be from 0.1 to 20 parts by mass and is preferably from 2.5 to 20 parts by mass, more preferably from 3 to 18 parts by mass, and even more preferably from 3 to 10 parts by mass, and may be from 3 to 8 parts by mass relative to 100 parts by mass of resin solids. When the content of the silane coupling agent is 0.1 parts by mass or greater relative to 100 parts by mass of resin solids, excellent moldability and appearance of a cured product may be achieved. When the content is 20 parts by mass or less, excellent thermal resistance of a cured product may be achieved. In addition, when the content of the silane coupling agent is 3 to 8 parts by mass relative to 100 parts by mass of resin solids, even better moldability may be achieved.

Wet Dispersant

The thermosetting resin composition of the present embodiment may further contain a wet dispersant besides the specific dispersant (C). When the thermosetting resin composition includes such a wet dispersant, the dispersibility of the filler in the thermosetting resin composition may be further improved.

The wet dispersant may be any known dispersant (dispersion stabilizer) used to disperse a filler, and examples include DISPER BYK-110, 111, 118, 180, 161, BYK-W996, W9010, and W903 available from BYK Japan KK.

The content of the wet dispersant is not particularly limited but is preferably 0.5 parts by mass or greater and 5.0 parts by mass or less relative to 100 parts by mass of resin solids. When the proportion of the wet dispersant is within the above range, even better moldability, appearance of a cured product, and thermal resistance of a cured product may be achieved.

Curing Accelerator

The thermosetting resin composition of the present embodiment may further contain a curing accelerator. The curing accelerator is not particularly limited, but examples include imidazoles, such as triphenylimidazole; organic peroxides, such as benzoyl peroxide, lauroyl peroxide, acetyl peroxide, parachlorobenzoyl peroxide, and di-tert-butyl-diperphthalate; azo compounds, such as azobisnitrile; tertiary amines, such as N,N-dimethylbenzylamine, N,N-dimethylaniline, N,N-dimethyltoluidine, 2-N-ethylanilinoethanol, tri-n-butylamine, pyridine, quinoline, N-methylmorpholine, triethanolamine, triethylenediamine, tetramethylbutanediamine, and N-methylpiperidine; phenols, such as phenol, xylenol, cresol, resorcin, and catechol; organometallic salts, such as lead naphthenate, lead stearate, zinc naphthenate, zinc octylate, manganese octylate, tin oleate, dibutyltin malate, manganese naphthenate, cobalt naphthenate, and iron acetylacetone; those formed by dissolving these organometallic salts in hydroxyl group-containing compounds, such as phenol and bisphenol; inorganic metal salts, such as tin chloride, zinc chloride, and aluminum chloride; and organotin compounds, such as dioctyl tin oxide and other alkyl tins, and alkyl tin oxides. Among these, triphenylimidazole tends to accelerate the curing reaction and further improve glass transition temperature and thus is particularly preferred.

Solvent

The thermosetting resin composition of the present embodiment may further contain a solvent. When the thermosetting resin composition of the present embodiment includes a solvent, viscosity may be reduced during preparation of the thermosetting resin composition, and handling properties (handleability) may be further improved, and properties for impregnating a substrate may be further improved.

The solvent is not particularly limited as long as the solvent can dissolve a part or whole of each component in the thermosetting resin composition, but examples include ketones (such as acetone and methyl ethyl ketone), aromatic hydrocarbons (e.g., such as toluene and xylene), amides (e.g., such as dimethyl formaldehyde), propylene glycol monomethyl ether, and acetate of propylene glycol monomethyl ether. One of these solvents is used alone, or two or more in combination.

Examples of a method of manufacturing the thermosetting resin composition of the present embodiment include a method of collectively or sequentially blending each component in a solvent and stirring the mixture. Here, a known process, such as stirring, mixing, and kneading, is used to uniformly dissolve or disperse each component.

Applications

As described above, the thermosetting resin composition of the present embodiment can exhibit excellent moldability, and excellent appearance, thermal conductivity, thermal resistance, and processability for drilling of a cured product in a well-balanced manner. Thus, the thermosetting resin composition of the present embodiment is suitably used in a metal foil-clad laminate and a printed wiring board.

Prepreg

A prepreg of the present embodiment includes a substrate and the thermosetting resin composition of the present embodiment, the substrate being impregnated or coated with the thermosetting resin composition. The prepreg may be produced by a known method as described above, and specifically, the prepreg is formed by impregnating or coating a substrate with the thermosetting resin composition of the present embodiment and then heat-drying the substrate under conditions of 100 to 200° C. to semi-cure (B-stage) the composition.

The prepreg of the present embodiment also includes a form of a cured product formed by heat-curing a semi-cured prepreg under conditions of a heating temperature of 180 to 230° C. and a heating time of 60 to 180 minutes.

The content of the thermosetting resin composition (including the filler) in the prepreg is preferably from 30 to 90 mass %, more preferably from 35 to 85 mass %, and even more preferably from 40 to 80 mass % relative to a total amount of the prepreg. When the prepreg has a content of the thermosetting resin composition within the above range, moldability may be improved.

The substrate is not particularly limited, and examples include known substrates used in materials for various printed wiring boards. Specific examples of the substrate include glass substrates, inorganic substrates other than glass (e.g., inorganic substrates constituted of an inorganic fiber other than glass, such as quartz), and organic substrates (e.g., organic substrates constituted of an organic fiber, such as a wholly aromatic polyamide, polyester, polyparaphenylene benzoxazole, and polyimide). One of these substrates is used alone, or two or more in combination. Among these, from the viewpoint of even better dimensional stability under heat, the substrate is preferably a glass substrate.

Examples of the fiber constituting the glass substrate include fibers of E glass, D glass, S glass, T glass, Q glass, L glass, NE glass, HME glass, or the like. Among these, from the viewpoints of even better strength and low water absorbance, the fiber constituting the glass substrate is preferably a fiber of one or more selected from the group consisting of E glass, D glass, S glass, T glass, Q glass, L glass, NE glass, and HME glass.

The form of the substrate is not particularly limited, but examples include forms of woven fabrics, nonwoven fabrics, rovings, chopped strand mats, and surfacing mats. The weave of the woven fabric is not particularly limited, but known examples include plain weave, mat weave, and twill weave, and the weave can be appropriately selected and used from these known weaves according to the intended application or performance. In addition, a material produced by subjecting these to fiber opening, or a glass woven fabric surface-treated with a silane coupling agent or the like is suitably used. The thickness and mass of the substrate are not particularly limited, but typically, a substrate with a thickness from approximately 0.01 to 0.1 mm is suitably used.

Resin Sheet

A resin sheet of the present embodiment includes a support and the thermosetting resin composition of the present embodiment disposed on a surface of the support. The resin sheet of the present embodiment may be formed, for example, by coating the thermosetting resin composition of the present embodiment on one or both sides of the support. The resin sheet of the present embodiment can be manufactured, for example, by coating the thermosetting resin composition used in the prepreg or the like directly on the support, such as a metal foil or a film, and drying.

The support is not particularly limited, but, for example, a known support used in various printed wiring board materials can be used, and the support is preferably a resin sheet or a metal foil. Examples of the resin film and the metal foil include resin films, such as a polyimide film, a polyamide film, a polyester film, a polyethylene terephthalate (PET) film, a polybutylene terephthalate (PBT) film, a polypropylene (PP) film, and a polyethylene (PE) film; and metal foils, such as an aluminum foil, a copper foil, and a gold foil. Among these, the support is preferably an electrolytic copper foil or a PET film.

The resin sheet of the present embodiment is produced, for example, by coating the thermosetting resin composition of the present embodiment on a support and then semi-curing (B-staging) the composition. A method of manufacturing the resin sheet of the present embodiment is typically preferably a method of manufacturing a composite of a B-staged resin and a support. Specifically, examples include a method of coating the thermosetting resin composition described above on a support, such as a copper foil, then semi-curing the composition by such a process as heating in a dryer at 100 to 200° C. for 1 to 60 minutes to manufacture the resin sheet. The amount of the thermosetting resin composition deposited on the support is preferably in a range of 1.0 μm or greater and 300 μm or less in terms of resin thickness of the resin sheet. The resin sheet of the present embodiment can be used as a build-up material for a printed wiring board.

Metal Foil-Clad Laminate

A metal foil-clad laminate of the present embodiment includes a laminate formed of: one or more selected from the group consisting of the prepreg and resin sheet of the present embodiment; and a metal foil disposed on one or both sides of the laminate. The laminate may be formed of one prepreg or resin sheet and may be formed of a plurality of prepregs and/or resin sheets.

The metal foil (a conductor layer) is any metal foil used in various printed wiring board materials, and examples include metal foils, such as a copper foil and an aluminum foil, and examples of the copper foil include a rolled copper foil and an electrolytic copper foil. The thickness of the conductor layer is, for example, from 1 to 70 μm and preferably from 1.5 to 35 μm.

A method of molding the metal foil-clad laminate and the molding conditions are not particularly limited, and a technique and conditions for typical laminates for printed wiring boards and multilayer boards can be applied. For example, in molding the laminate or metal foil-clad laminate, a multi-stage press, a multi-stage vacuum press, a continuous molding machine, an autoclave molding machine, or the like can be used. In addition, in molding the laminate or metal foil-clad laminate (lamination molding), a temperature is typically from 100 to 300° C., a surface pressure is typically from 2 to 100 kgf/cm², and a heating time is typically in a range of 0.05 to 5 hours. Furthermore, post-curing can be also performed at a temperature of 150 to 300° C. as necessary. In particular, when a multi-stage press is used, from the viewpoint of sufficiently accelerating curing of the prepreg, the molding conditions are preferably a temperature of 200° C. to 250° C., a pressure of 10 to 40 kgf/cm², and a heating time of 80 minutes to 130 minutes, and more preferably a temperature of 215° C. to 235° C., a pressure of 25 to 35 kgf/cm², and a heating time of 90 minutes to 120 minutes. In addition, also a multilayer board can be formed by lamination molding the prepreg described above and a separately produced wiring board for an inner layer in combination.

Printed Wiring Board

A printed wiring board of the present embodiment has an insulating layer and a conductor layer formed on a surface of the insulating layer, and the insulating layer contains the thermosetting resin composition of the present embodiment. The printed wiring board of the present embodiment can be formed, for example, by etching a predetermined wiring pattern on the metal foil of the metal foil-clad laminate of the present embodiment to form a conductor layer. A printed wiring board of the present embodiment may be a printed wiring board including an insulating layer formed of one or more selected from the group consisting of the prepreg or resin sheet described above, and a conductor layer formed on a surface of the insulating layer.

The printed wiring board of the present embodiment can be manufactured, specifically, by the following method, for example. First, the metal foil-clad laminate of the present embodiment is prepared. A predetermined wiring pattern is etched on the metal foil of the metal foil-clad laminate to produce an inner layer substrate having a conductor layer (inner layer circuit). Then, a predetermined number of insulating layers and a metal foil for an outer layer circuit are layered in this order on the conductor layer (interior circuit) surface of the inner layer substrate and integrally molded (lamination molded) under heat and pressure to obtain a laminate. The method of the lamination molding and the molding conditions are the same as the method of lamination molding and the molding conditions for the laminate and metal foil-clad laminate described above. Then, the laminate is subjected to hole formation for a through hole or a via hole, and a plated metal film, which allows conduction between the conductor layer (interior circuit) and the metal foil for the outer layer circuit, is formed on a wall surface of the hole thus formed. Then, a predetermined wiring pattern is etched on the metal foil for the outer layer circuit to produce an outer layer substrate having a conductor layer (outer layer circuit). The printed wiring board is thus manufactured.

In addition, when the metal foil-clad laminate is not used, a conductor layer serving as a circuit may be formed in the insulating layer to produce the printed wiring board. Here, an electroless plating technique can also be used to form the conductor layer.

EXAMPLES

Hereinafter, the present invention will be described in further detail with reference to examples, but the present invention is not limited to these examples.

Synthesis Example 1: Synthesis of 1-Naphthol Aralkyl Cyanate Ester Resin (SNCN)

First, 300 g (1.28 mol in terms of an OH group) of an α-naphthol aralkyl resin (SN495V, an OH group equivalent of 236 g/eq., available from Nippon Steel Chemical Co., Ltd.) and 194.6 g (1.92 mol) of triethylamine (1.5 mol relative to 1 mol of hydroxy groups) were dissolved in 1800 g of dichloromethane, and this solution was used as a solution 1.

While a mixture of 125.9 g (2.05 mol) of cyanogen chloride (1.6 mol relative to 1 mol of hydroxy groups), 293.8 g of dichloromethane, 194.5 g (1.92 mol) of 36% hydrochloric acid (1.5 mol relative to 1 mol of hydroxy groups), and 1205.9 g of water were stirred and a liquid temperature of −2 to −0.5° C. was maintained, the solution 1 was poured over 30 minutes.

After the completion of pouring the solution 1, the mixture was stirred at the same temperature for 30 minutes, and then a solution (solution 2) prepared by dissolving 65 g (0.64 mol) of triethylamine (0.5 mol relative to 1 mol of hydroxy groups) in 65 g of dichloromethane was poured over 10 minutes. After the completion of pouring the solution 2, the mixture was stirred at the same temperature for 30 minutes and the reaction was completed.

The reaction liquid was then allowed to stand, and the organic phase and the aqueous phase were separated. The resulting organic phase was washed with 1300 g of water 5 times. The electrical conductivity of the wastewater from the fifth water washing was 5 μS/cm, confirming that removable ionic compounds were sufficiently removed by washing with water.

The organic phase after water washing was concentrated under reduced pressure and finally concentrated to dryness at 90° C. for 1 hour, and 331 g of the target 1-naphthol aralkyl cyanate ester compound (SNCN) (an orange viscous material) was produced. The mass average molecular weight Mw of the resulting SNCN was 600. In addition, the infrared absorption spectrum of the SNCN showed an absorption at 2250 cm$^1$ (a cyanate ester group) and no absorption of a hydroxy group.

Synthesis Example 2: Synthesis of Dispersant A

A dispersant A was produced with reference to a method described in Example 1-1 of WO 2016/170760. The resulting dispersant A had a pH of 8.4 and a weight average molecular weight of 3730 by GPC (calibrated with polystyrene). The pH was measured according to JIS K 1557-5 (Plastic-Polyurethane Raw Material Polyol Test Method).

Example 1

A varnish was prepared by mixing 30 parts by mass of the 1-naphthol aralkyl cyanate ester resin synthesized in Synthesis Example 1, 15 parts by mass of a novolac maleimide resin ("BMI-2300", which is a product of Daiwa Kasei Industry Co., Ltd.), 15 parts by mass of a bismaleimide resin ("BMI-70", which is a product of K-I Chemical Industry Co., Ltd.), 35.3 parts by mass of a naphthylene ether epoxy resin ("HP-6000", which is a product of DIC Corporation), 4.7 parts by mass of a trisphenol epoxy resin ("EPPN-501HY", which is a product of Nippon Kayaku Co., Ltd.), 100 parts by mass of boron nitride ("MBN-010T", which is a product of Mitsui Chemicals, Inc.), 15 parts by mass of an epoxy silane coupling agent ("Z6040", which is a product of Dow Corning Toray Co., Ltd.), 2.5 parts by mass of the dispersant A synthesized in Synthesis Example 2, 0.50 parts by mass of 2,4,5-triphenylimidazole (available from Tokyo Chemical Industry Co., Ltd.), and 0.01 parts by mass of manganese octylate (Nikka Octhix Manganese, a metal content of 8%) in methyl ethyl ketone (a varnish production process).

Methyl ethyl ketone in this varnish was distilled off, and a mixed resin powder was formed (a resin powder production process). A mold with a side length of 100 mm and a thickness of 0.8 mm was filled with the mixed resin powder, and the mold was vacuum-pressed at a pressure of 40 kg/cm$^2$ and a temperature of 230° C. for 120 minutes, and a cured product with a side length of 100 mm and a thickness of 0.8 mm was formed (a cured product production process).

Example 2

A cured product was formed in the same manner as in Example 1 with the exception that 1.0 parts by mass of the dispersant A was added in place of 2.5 parts by mass in the varnish production process.

Example 3

A cured product was produced in the same manner as in Example 1 with the exception that 5.0 parts by mass of the dispersant A was added in place of 2.5 parts by mass in the varnish production process.

Example 4

An S glass woven fabric (a thickness of 40 μm) was impregnated and coated with the varnish produced in the varnish production process of Example 1, heat-dried at 150° C. for 3 minutes, and a prepreg with a content of resin composition solids (including fillers) of 74 mass % was produced (a prepreg production process)

Example 5

A cured product was produced in the same manner as in Example 2 with the exception that 7.5 parts by mass of the epoxy silane coupling agent was added in place of 15 parts by mass in the varnish production process.

Example 6

A cured product was produced in the same manner as in Example 2 with the exception that 3.8 parts by mass of the epoxy silane coupling agent was added in place of 15 parts by mass in the varnish production process.

Example 7

A cured product was produced in the same manner as in Example 2 with the exception that the epoxy silane coupling agent was not added.

Comparative Example 1

A mixed resin powder was produced in the same manner as in Example 1 with the exception that 2.5 parts by mass of a phosphate metal salt wet dispersant ("BYK-W903", which is a product of BYK Japan KK, a pH of 5.5 as measured in the same manner as described above, a weight average molecular weight of 3880 by GPC (calibrated with polystyrene)) was used in place of the dispersant A in the varnish production process and the resin powder production process. The resulting mixed resin powder was used in an attempt to produce a cured product in the same manner as in Example 1 but could not be molded.

Comparative Example 2

A mixed resin powder was produced in the same manner as in Example 1 with the exception that 2.5 parts by mass of a polyurethane wet dispersant having an amine value ("DISPERBYK-161", which is a product of BYK Japan KK, a pH of 7.7 as measured in the same manner as described above, a weight average molecular weight of 75400 by GPC (calibrated with polystyrene)) was used in place of the dispersant A in the varnish production process and the resin powder production process. The resulting mixed resin powder was used in an attempt to produce a cured product in the same manner as in Example 1 but could not be molded.

Comparative Example 3

A mixed resin powder was produced in the same manner as in Example 1 with the exception that 2.5 parts by mass of a phosphate ester wet dispersant having an acid value ("BYK-111", which is a product of BYK Japan KK, a pH of 2 as measured in the same manner as described above, a weight average molecular weight of 1210 by GPC (calibrated with polystyrene)) was used in place of the dispersant A in the varnish production process and the resin powder production process. The resulting mixed resin powder was used in an attempt to produce a cured product in the same manner as in Example 1 but could not be molded.

Comparative Example 4

A mixed resin powder was produced in the same manner as in Example 1 with the exception that 2.5 parts by mass of an acrylic wet dispersant having an amine value ("BYK-2009", which is a product of BYK Japan KK, a pH of 7.8 as measured in the same manner as described above, a weight average molecular weight of 4080 by GPC (calibrated with polystyrene)) was used in place of the dispersant A in the varnish production process and the resin powder production process. The resulting mixed resin powder was used in an attempt to produce a cured product in the same manner as in Example 1 but could not be molded.

Comparative Example 5

A cured product was produced in the same manner as in Example 1 with the exception that 5.0 parts by mass of a phosphate metal salt wet dispersant ("BYK-W903", which is a product of BYK Japan KK), 1.0 parts by mass of a polyurethane wet dispersant having an amine value ("DISPERBYK-161", which is a product of BYK Japan KK), 1.0 parts by mass of a phosphate ester wet dispersant having an acid value ("BYK-111", which is a product of BYK Japan KK), and 0.3 parts by mass of an acrylic wet dispersant having an amine value ("BYK-2009", which is a product of BYK Japan KK) were used in place of the dispersant A in the varnish production process.

Comparative Example 6

An S glass woven fabric (a thickness of 40 μm) was impregnated and coated with the varnish produced in the varnish production process of Comparative Example 5 and heat-dried at 150° C. for 3 minutes in an attempt to produce a prepreg but could not be molded.

Method of manufacturing copper-clad laminate Two or eight prepregs produced as in Example 4 were layered, a 12-μm thick electrolytic copper foil (3EC-M3-VLP available from Mitsui Mining & Smelting Co., Ltd.) was disposed on the upper and lower sides of the layered prepregs, a vacuum press was performed at a pressure of 30 kg/cm2 and a temperature of 220° C. for 120 minutes, and a copper-clad laminate with an insulating layer thickness of 0.2 mm or 0.8 mm was produced. The resulting copper-clad laminates were used to evaluate each property below.

(1) Varnish Gel Time

The varnish produced in each of Examples and Comparative Examples was placed on a hot press at 170° C., and the time until the varnish was cured was measured. The measurement results are shown in a table.

(2) Moldability Evaluation

The appearance of the cured product or the copper-clad laminate with the etched surface copper foil produced in each of Examples and Comparative Examples was visually evaluated according to the following evaluation criteria. The evaluation results are shown in the table. Examples evaluated as "Poor" were not further evaluated for properties described later.

Good: Moldable and uniform appearance, and no voids occurred.

Marginal: Moldable but non-uniform appearance, and a void(s) occurred.

Poor: Not moldable.

(3) Minimum Melt Viscosity

The minimum melt viscosity was measured with a rheometer (ARES-G2 available from TA Instruments) using 1 g of the mixed resin powder (referring to the powder prior to the cured product described in Example 1) or a resin powder produced by crumpling and loosening the prepreg produced in each of Examples and Comparative Examples and collecting as a sample. Here, the minimum melt viscosity of the resin powder was measured using a disposable plate with a plate diameter of 25 mm under conditions of a temperature increase rate of 2° C./min in a temperature range of 40° C. to 210° C., a frequency of 10.0 rad/sec, and a strain of 0.1%. The evaluation results are shown in the table.

(4) Thermal Conductivity

In Example 4, where a laminate was produced, the surface copper foil of the resulting copper-clad laminate (an insulating layer thickness of 0.8 mm) was removed by etching. The density and specific heat of the copper-clad laminate with the etched surface copper foil or the cured product (in other examples where a laminate was not produced) were measured. Specific heat was measured with a Q100 DSC, which is a product of TA Instruments. In addition, the thermal diffusivity in the thickness direction of the copper foil-clad laminate or cured product described above was measured. The thermal diffusivity was measured with a xenon flash analyzer (Bruker: LFA447 Nanoflash). The thermal conductivity was calculated using the formula below. The measurement results are shown in the table. Thermal conductivity (W/m·K)=density $(kg/m)^3$×specific heat (kJ/kg·K)×thermal diffusivity $(m^2/S)$×1000

(5) Thermal Resistance (Tg)

In Example 4, where a laminate was produced, the surface copper foil of the copper-clad laminate (an insulating layer thickness of 0.8 mm) was removed by etching. The copper-clad laminate with the etched surface copper foil or the cured product (in other examples where a laminate was not produced) was cut into a size of 5.0 mm×20 mm with a dicing saw, and a sample for measurement was produced. Using this sample for measurement, the glass transition temperature (Tg) was measured (an average value of n=3) by a DMA method using a dynamic viscoelasticity analyzer (available from TA Instruments) in accordance with JIS C6481. The measurement results are shown in the table.

(6) Processability for Drilling

Four copper-clad laminates (an insulating layer thickness of 0.2 mm) produced in Example 4 were layered, PS-1160G (a product of Risho Kogyo Co., Ltd.) was used for a backup board, LE450 (a product of Mitsubishi Gas Chemical Company, Inc.) was used for an entry sheet, and drilling was performed with ND-1 V212 (a product of Hitachi Via Mechanics, Ltd.) at a rotation speed of 2000 kpm and a feed rate of 2.0 m/min. Hole positions (μm) and hole diameters of 1 to 5000 holes were measured with an analyzer, and the processability for drilling (maximum hole diameter and hole position accuracy) was evaluated based on the measured values.

TABLE 1

| | Example 1 | Example 2 | Example 3 | Example 4 | Example 5 | Example 6 | Example 7 | Comparative Example 1 | Comparative Example 2 | Comparative Example 3 | Comparative Example 4 | Comparative Example 5 | Comparative Example 6 |
|---|---|---|---|---|---|---|---|---|---|---|---|---|---|
| Varnish gel time (S) | 375.7 | 285.6 | 176 | 375.7 | 190 | 166.7 | 133.3 | 178.1 | 155.1 | 192.9 | 132.6 | 249.7 | 249.7 |
| Minimum melt viscosity (poise) | 76.58 | 151.804 | 137.087 | 47.709 | 43.079 | 61.798 | 58.809 | — | — | — | — | 576.801 | — |
| Appearance evaluation | Good | Good | Good | Good | Good | Good | Good | Poor | Poor | Poor | Poor | Marginal | Poor |
| Thermal conductivity (W/mk) (Z-axis 25° C.) | 0.85 | 0.9 | 0.81 | 0.83 | 0.87 | 0.87 | 0.84 | — | — | — | — | 0.81 | — |
| Thermal conductivity (W/mk) (XY-axis 25° C.) | 1.18 | 1.22 | 1.13 | 1.17 | 1.23 | 1.22 | 1.27 | — | — | — | — | 1.12 | — |

TABLE 1-continued

| | Example 1 | Example 2 | Example 3 | Example 4 | Example 5 | Example 6 | Example 7 | Comparative Example 1 | Comparative Example 2 | Comparative Example 3 | Comparative Example 4 | Comparative Example 5 | Comparative Example 6 |
|---|---|---|---|---|---|---|---|---|---|---|---|---|---|
| Tg (° C.) | 308 | 318 | 305 | 299 | 314 | 319 | 320 | — | — | — | — | 295 | — |
| Maximum hole diameter (up to 5000 holes) (μm) | — | — | — | 17 | — | — | — | — | — | — | — | — | — |
| Hole position accuracy (from 1 to 5000) hole average (μm) | — | — | — | 8.7 | — | — | — | — | — | — | — | — | — |

The thermosetting resin composition of Examples 1 to 3 exhibited excellent moldability and were able to provide cured products with excellent appearance, thermal conductivity, and thermal resistance compared to the thermosetting resin compositions of Comparative Examples 1 to 4. In addition, the resin composition of Comparative Example 5 was moldable but its cured product was inferior in terms of thermal conductivity, thermal resistance, and appearance of a cured product compared to the cured products of Examples 1 to 3.

The thermosetting resin composition of Example 1 exhibited excellent moldability also when processed into a laminate as a prepreg and was able to provide a cured product with excellent appearance, thermal conductivity, and thermal resistance, but the resin composition of Example 4 could not provide a laminate as shown in Comparative Example 6.

The present application is based on Japanese Patent Application (JP 2018-197764) filed with the Japan Patent Office on Oct. 19, 2018, the content of which is incorporated herein by reference.

The invention claimed is:

1. A thermosetting resin composition comprising
a thermosetting resin (A) containing a cyanate ester compound (D),
boron nitride (B), and
a dispersant (C) with a pH of 8 or higher, the dispersant (C) having a block chain (i) including a repeating unit represented by Formula [i]:

[Chem. 1]

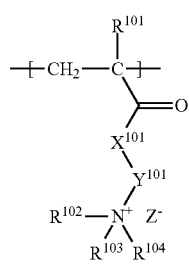

(I)

where, in Formula [i]:
$R^{101}$ represents a hydrogen atom or an alkyl group,
$X^{101}$ represents —NH— or —O—,
$Y^{101}$ represents a divalent linking group,
$R^{102}$ to $R^{104}$ each independently represent an alkyl group, an arylalkyl group, or a heteroarylalkyl group, and
$Z^-$ represents a counter anion;

wherein
the cyanate ester compound (D) contains one or more selected from the group consisting of:
a naphthol aralkyl cyanate ester compound represented by Formula (1):

[Chem. 3]

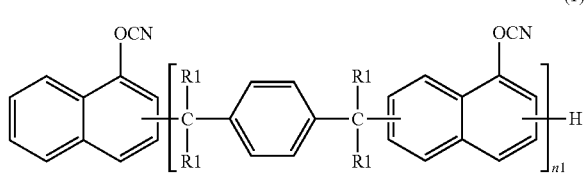

(1)

where each R1 independently represents a hydrogen atom or a methyl group, and n1 represents an integer from 1 to 50, a biphenyl aralkyl cyanate ester compound represented by Formula (2):

[Chem. 4]

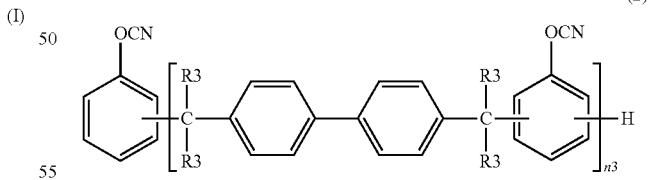

(2)

where each R3 independently represents a hydrogen atom or a methyl group, and n3 represents an integer from 1 to 50, and a diallyl bisphenol A cyanate ester compound represented by Formula (3):

[Chem. 5]

(3)

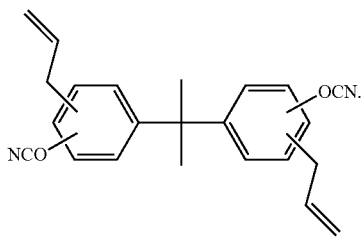

2. The thermosetting resin composition according to claim 1, wherein the dispersant (C) further comprises a polymer including, as a monomer unit a tertiary amine compound containing a (meth)acryl group and/or a quaternary ammonium compound containing a (meth)acryl group.

3. The thermosetting resin composition according to claim 1, wherein the dispersant (C) further comprises a block chain (ii) including a repeating unit represented by Formula [II]:

[Chem. 2]

(II)

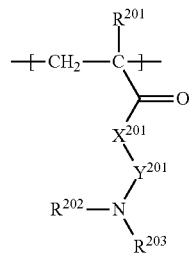

where, in Formula [II], $R^{201}$ represents a hydrogen atom or an alkyl group; $X^{201}$ represents —NH— or —O—; $Y^{201}$ represents a divalent linking group; $R^{202}$ and $R^{203}$ each independently represent an alkyl group, an arylalkyl group, or a heteroarylalkyl group.

4. The thermosetting resin composition according to claim 1, wherein a content of the dispersant (C) is from 0.1 to 20 parts by mass relative to 100 parts by mass of resin solids.

5. The thermosetting resin composition according to claim 1, wherein a weight average molecular weight of the dispersant (C) is $1.0 \times 10^3$ or higher and lower than $5.0 \times 10^3$.

6. The thermosetting resin composition according to claim 1, wherein the thermosetting resin (A) further comprises one or more selected from the group consisting of a maleimide compound (E), and an epoxy compound (F).

7. The resin composition according to claim 1, wherein a content of the cyanate ester compound (D) is from 1 to 90 parts by mass relative to 100 parts by mass of resin solids.

8. The thermosetting resin composition according to claim 6, wherein the maleimide compound (E) comprises one or more selected from the group consisting of bis(4-maleimidophenyl)methane, 2,2-bis{4-(4-maleimidophenoxy)-phenyl}propane, bis(3-ethyl-5-methyl-4-maleimidophenyl)methane, a maleimide a maleimide compound represented by Formula (4), and a maleimide compound represented by Formula (5):

[Chem. 6]

(4)

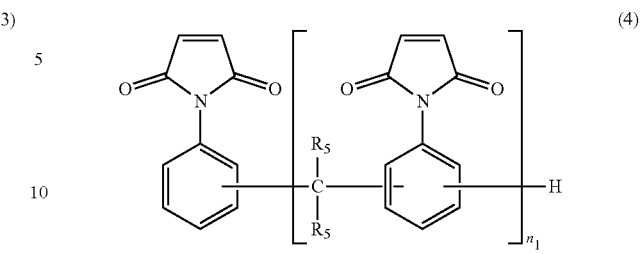

where, in Formula (4), $R_5$ each independently represents a hydrogen atom or a methyl group; and $n_1$ represents an integer of 1 or greater; and

[Chem. 7]

(5)

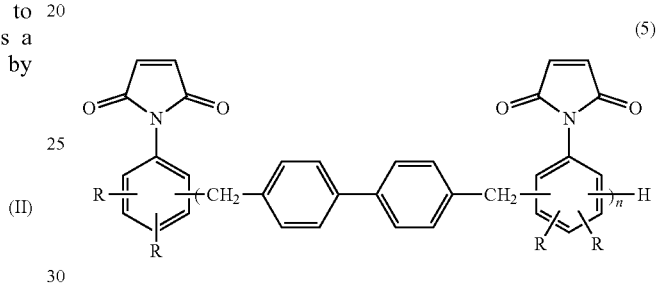

where, in Formula (5), R's present in plurality each independently represents a hydrogen atom, an alkyl group having from 1 to 5 carbon atoms, or a phenyl group; and n is an average value and represents $1 < n \leq 5$.

9. The thermosetting resin composition according to claim 6, wherein a content of the maleimide compound (E) is from 1 to 90 parts by mass relative to 100 parts by mass of resin solids.

10. The thermosetting resin composition according to claim 6, wherein the epoxy compound (C) is one or more selected from the group consisting of a biphenyl aralkyl epoxy resin, naphthylene ether epoxy resin, trisphenol methane epoxy resin, bisphenol A epoxy resin, bisphenol F epoxy resin, phenol novolac epoxy resin, cresol novolac epoxy resin, bisphenol A novolac epoxy resin, brominated bisphenol A epoxy resin, brominated phenol novolac epoxy resin, biphenyl epoxy resin, phenol aralkyl epoxy resin, and naphthol aralkyl epoxy resin.

11. The thermosetting resin composition according to claim 6, wherein the epoxy compound (F) includes a polyfunctional epoxy compound having three or more epoxy groups per molecule.

12. The thermosetting resin composition according to claim 6, wherein a content of the epoxy compound (F) is from 1 to 90 parts by mass relative to 100 parts by mass of resin solids in the resin composition.

13. The thermosetting resin composition according to claim 1, wherein a content of the boron nitride (B) is from 1 to 1600 parts by mass relative to 100 parts by mass of resin solids.

14. The thermosetting resin composition according to claim 1, further comprising from 0.1 to 20 parts by mass of a silane coupling agent relative to 100 parts by mass of resin solids.

15. The thermosetting resin composition according to claim 1, wherein the thermosetting resin composition is for a printed wiring board.

16. A prepreg having a substrate and the thermosetting resin composition described claim 1, the substrate being impregnated or coated with the thermosetting resin composition.

17. A resin sheet having a support and the thermosetting resin composition described in claim 1, the thermosetting resin composition being disposed on a surface of the support.

18. A metal foil-clad laminate having:
a laminate formed of one or more selected from the group consisting of the prepreg described in claim 16 and a resin sheet; and
a metal foil disposed on one or both sides of the laminate, wherein
the resin sheet has a support and the thermosetting resin composition is disposed on a surface of the support.

19. A printed wiring board having an insulating layer and a conductor layer formed on a surface of the insulating layer, wherein the insulating layer includes the thermosetting resin composition described in claim 1.

* * * * *

UNITED STATES PATENT AND TRADEMARK OFFICE
CERTIFICATE OF CORRECTION

| | |
|---|---|
| PATENT NO. | : 11,760,871 B2 |
| APPLICATION NO. | : 17/285659 |
| DATED | : September 19, 2023 |
| INVENTOR(S) | : Y. Nakazumi et al. |

It is certified that error appears in the above-identified patent and that said Letters Patent is hereby corrected as shown below:

In the Claims

Column 37, Line 2 (Claim 16, Line 2), please change "described claim" to -- described in claim --.

Signed and Sealed this
Twenty-fifth Day of June, 2024

Katherine Kelly Vidal
*Director of the United States Patent and Trademark Office*